United States Patent
Fujita et al.

(10) Patent No.: US 9,134,383 B2
(45) Date of Patent: Sep. 15, 2015

(54) HALL DEVICE, MAGNETIC SENSOR HAVING SAME, AND SIGNAL CORRECTING METHOD THEREOF

(71) Applicant: ASAHI KASEI MICRODEVICES CORPORATION, Tokyo (JP)

(72) Inventors: Taisuke Fujita, Tokyo (JP); Makoto Kataoka, Tokyo (JP); Tatsuhiko Yayoi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 118 days.

(21) Appl. No.: 14/104,334

(22) Filed: Dec. 12, 2013

(65) Prior Publication Data
US 2014/0184211 A1 Jul. 3, 2014

Related U.S. Application Data

(60) Provisional application No. 61/751,306, filed on Jan. 11, 2013.

(30) Foreign Application Priority Data

Dec. 28, 2012 (JP) ................................. 2012-287772
Oct. 2, 2013 (JP) ................................. 2013-207408

(51) Int. Cl.
*G01N 27/72* (2006.01)
*G01R 33/00* (2006.01)
(Continued)

(52) U.S. Cl.
CPC ........ *G01R 33/0029* (2013.01); *G01R 33/0052* (2013.01); *G01R 33/0082* (2013.01); *G01R 33/07* (2013.01); *H01L 43/065* (2013.01)

(58) Field of Classification Search
CPC ............... G01R 33/0029; G01R 33/07; G01R 33/0052–33/0082; H01L 43/065
USPC ............. 324/200, 207.2, 251, 117 H, 207.13, 324/207.14, 207.22, 219–241; 702/145–147, 150–151; 73/514.39; 384/448

See application file for complete search history.

(56) References Cited

U.S. PATENT DOCUMENTS 8,610,429 B2 * 12/2013 Nagasaki et al. ............. 324/244
8,773,124 B2 * 7/2014 Ausserlechner .............. 324/252
(Continued)

FOREIGN PATENT DOCUMENTS

JP 2005-333103 A 12/2005
JP 2011-007658 A 1/2011
(Continued)

OTHER PUBLICATIONS

European Search Report dated Jan. 16, 2015, for the corresponding European Patent Application No. 13197389.3.
(Continued)

*Primary Examiner* — Melissa Koval
*Assistant Examiner* — Trung Nguyen
(74) *Attorney, Agent, or Firm* — Morgan, Lewis & Bockius LLP

(57) ABSTRACT

By restricting the concentration and the depth of an n-type impurity region which is a magnetosensitive portion of a Hall device to appropriate ranges, it is possible to improve linearity of temperature characteristics in detecting a magnetic field intensity with high accuracy.
In order to obtain linearity of the temperature characteristics of the constant-current sensitivity, there is provided a Hall device including a p-type impurity region 1 and an n-type impurity region 2 that is disposed on the p-type impurity region 1 and that serves as a magnetosensitive portion, wherein an n-type impurity concentration N and a distribution depth D of the n-type impurity region 2 satisfy relational expressions of $N<1.0\times10^{16}$ and $N>3.802\times10^{16}\times D^{-1.761}$.

39 Claims, 13 Drawing Sheets

(51) Int. Cl.
*G01R 33/07* (2006.01)
*H01L 43/06* (2006.01)

(56) References Cited

U.S. PATENT DOCUMENTS

2005/0230770 A1 10/2005 Oohira
2006/0224350 A1 10/2006 Tanizawa
2009/0009164 A1 1/2009 Utsuno
2010/0164483 A1 7/2010 Namai et al.

2012/0086442 A1 4/2012 Haas et al.

FOREIGN PATENT DOCUMENTS

JP 2012-204616 A 10/2012
WO 2007/116823 A1 10/2007

OTHER PUBLICATIONS

Partial European Search Report dated Jun. 27, 2014 (5 sheets).

* cited by examiner

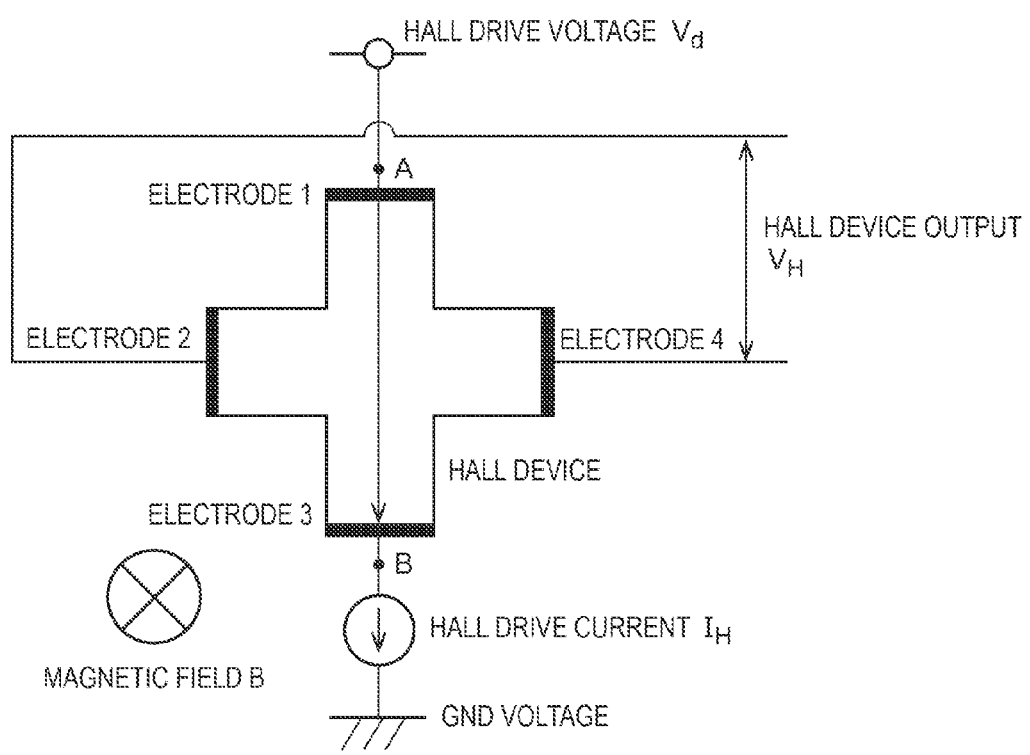

HALL DEVICE, MAGNETIC SENSOR HAVING SAME, AND SIGNAL CORRECTING METHOD THEREOF

TECHNICAL FIELD

The present invention relates to a Hall device, a magnetic sensor having the same, and a signal correcting method thereof.

BACKGROUND ART

A current sensor for detecting a magnetic field generated by current, a rotation angle sensor for detecting rotation of a magnet, a position sensor for detecting movement of a magnet, and the like have been known as a magnetic-sensor semiconductor integrated circuit having a Hall device built therein.

FIG. 1 is a diagram illustrating an example of a drive circuit of a Hall device. When Hall drive current $I_H$ flows from Electrode 1 to Electrode 3, it can be seen that a Hall device output $V_H$ is obtained between Electrode 2 and Electrode 4.

Methods of driving a Hall device are generally classified into two types of a constant-current drive method and a constant-voltage drive method. A method in which the Hall drive current $I_H$ is kept constant in FIG. 1 is the constant-current drive method, and a method in which a Hall drive voltage $V_d$ is kept constant is the constant-voltage drive method. Magnetic sensitivities in the drive methods are referred to as a constant-current sensitivity and a constant-voltage sensitivity, respectively.

In general, a Hall device has a configuration in which an n-type impurity region is disposed on the surface of a p-type semiconductor substrate layer formed of p-type silicon. The n-type impurity region serves as a magnetosensitive portion.

For example, Patent Document 1 discloses a vertical Hall device that can enhance a degree of freedom in selecting a substrate used to form a Hall device and a manufacturing method thereof. The vertical Hall device is formed on a semiconductor substrate formed of P-type silicon and outputs a Hall voltage signal corresponding to a magnetic field component when the magnetic field component parallel to the surface of the semiconductor substrate is applied to a magnetic detection portion HP in a state where a current including a component perpendicular to the surface of the semiconductor substrate is supplied to the magnetic detection portion HP in an N-type semiconductor region 12.

Patent Document 2 discloses that a concentration of an n-type impurity region suitable for an azimuth sensor is in a range of $1.0 \times 10^{16} \leq N \leq 3.0 \times 10^{16}$ (atoms/cm$^3$) in order to improve an SN ratio.

Patent Document 3 discloses a method of inspecting a 5-point temperature inspection in a pre-shipment test, recording the inspection result on an EEPROM, and correcting a polygonal line of 5-point temperatures to achieve an increase in detected magnetic field accuracy.

Patent Document 4 discloses a concentration distribution in the depth direction of an N-type region in an electrode portion of a Hall device. The N-type impurity concentration ranges from $5 \times 10^{17}$ atoms/cm$^3$ to $3 \times 10^{19}$ atoms/cm$^3$ within the range of the concentration distribution, that is, the range of 0.3 μm to 0.5 μm in the depth direction.

CITATION LIST

Patent Documents

Patent Document 1: JP 2005-333103 A
Patent Document 2: WO 2007/116823
Patent Document 3: US 2012/0086442 A
Patent Document 4: JP 2012-204616 A

SUMMARY OF THE INVENTION

Problem to be Solved

For example, as described in Patent Document 3, it is known that the magnetic sensitivity of a Hall device varies depending on a temperature. Since the temporal variation of the magnetic sensitivity causes a decrease in magnetic field detection accuracy, temperature characteristics of the magnetic sensitivity of a Hall device need to be corrected to calculate magnetic field intensity with high accuracy.

A relationship between the output of a Hall device and the magnetic field intensity is expressed by Expression (1). When the constant-current sensitivity is defined as SI(T), the drive current of the Hall device is defined as $I_H$, and the magnetic field intensity is defined as B, a signal obtained from the Hall device is Signal (T) of Expression (1). Since the constant-current sensitivity SI (T) has temperature dependency, the constant-current sensitivity needs to be divided by a coefficient proportional to the temperature dependency of the constant-current sensitivity in order to calculate the magnetic field intensity B with high accuracy.

$$\text{Signal}(T) = SI(T) \times I_H \times B \quad (1)$$

$$B = \frac{\text{Signal}(T)}{SI(T) \times I_H}$$

The constant-current sensitivity of the conventional Hall device has secondary temperature characteristics. Accordingly, the output when the conventional Hall device is left in a constant magnetic field has secondary temperature characteristics as expressed by Expression (2).

$$\text{Signal}(T) = SI(T) \times I_H \times B$$

$$SI(T) = aT^2 + bT + c$$

$$\Rightarrow \text{Signal}(T) = (aT^2 + bT + c) \times I_H \times B \quad (2)$$

As expressed by Expression (2), in order to calculate a magnetic field from a signal having secondary temperature characteristics with high accuracy, it is necessary to have a quadratic function of temperature as a correction function.

In recent years, a high-accuracy magnetic sensor has been required and a magnetic sensor having a correction residual error of 1.0% or less between −40° C. and 150° C. has been required, particularly, as an in-vehicle magnetic sensor.

Here, the correction residual error $E_R$ is a value expressed by the following expression.

$$E_R = (SI_{MAX} - SI_{MIN})/2$$

$SI_{MAX}$ represents the maximum magnetic sensitivity out of magnetic sensitivities after correction between −40° C. and 150° C. and $SI_{MIN}$ represents the minimum magnetic sensitivity out of magnetic sensitivities after correction between −40° C. and 150° C. $SI_{MAX}$ and $SI_{MIN}$ are values normalized with the magnetic sensitivity after correction at 25° C. The larger the correction residual error $E_R$ becomes, the more the magnetic sensitivity after correction between −40° C. and 150° C. varies. The smaller the correction residual error $E_R$ becomes, the less the magnetic sensitivity after correction between −40° C. and 150° C. varies.

In a magnetic sensor using the conventional Hall device, in order to set the correction residual error to 1.0% or less between −40° C. and 150° C., it is necessary to obtain an accurate quadratic correction function as a correction function for correcting the temperature characteristics of the magnetic sensitivity. The magnetic sensitivity of the Hall device has to be measured at a lot of temperatures in order to calculate the accurate quadratic correction function. Accordingly, in the conventional Hall device, much time and cost are taken for a test process for calculating the correction function.

The number of times of measuring magnetic sensitivity for calculating a correction function and the magnetic detection accuracy have a trade-off relationship. In the conventional Hall device, when the number of times of measuring magnetic sensitivity is reduced, there is a problem in that the magnetic detection accuracy is lowered and the correction residual error is not made to be equal to or less than 1.0% between −40° C. to 150° C.

The present invention is made in consideration of such circumstances and an object thereof is to provide a Hall device which can acquire a correction function having sufficient accuracy with a small number of times of measuring magnetic sensitivity, a magnetic sensor having the Hall device, and a signal correcting method thereof.

Solution to the Problem

In order to achieve the above-mentioned object, a first aspect of the present invention provides a Hall device comprising: a p-type impurity region; and an n-type impurity region disposed on the p-type impurity region and serving as a magnetosensitive portion, wherein an n-type impurity concentration N (atoms/cm$^3$) and a distribution depth D (μm) of the n-type impurity region satisfy following relational expressions:

$$N < 1.0 \times 10^{16} \text{ and}$$

$$N > 3.802 \times 10^{16} \times D^{-1.761}$$

wherein the n-type impurity concentration N represents a maximum concentration of the n-type impurity concentration in the n-type impurity region and the distribution depth D represents a length in depth direction from a point at which the n-type impurity concentration is a maximum to a point at which the n-type impurity concentration is 1/10 of the n-type impurity concentration N.

According to the first aspect, since the temperature characteristic of the magnetic sensitivity of the Hall device is substantially linear, it is possible to satisfactorily create a correction function with high accuracy even by preparing a correction function for correcting the temperature characteristic of the magnetic sensitivity from the result of measurement of the magnetic sensitivity at two temperatures of −40° C. and 150° C. According to the first aspect, it is possible to provide a Hall device capable of calculating a correction function with satisfactory high accuracy with a small number of times of measuring the magnetic sensitivity.

According to the second aspect of the present invention, in the above Hall device, the n-type impurity concentration N and the distribution depth D may satisfy a relational expression of $N > 3.410 \times 10^{16} \times D^{-1.293}$.

According to the second aspect of the present invention, since the temperature characteristic of the magnetic sensitivity of the Hall device is substantially linear, it is possible to satisfactorily create a correction function with high accuracy even by preparing a correction function for correcting the temperature characteristic of the magnetic sensitivity from the result of measurement of the magnetic sensitivity at two temperatures of 25° C. and 150° C. According to the second aspect of the present invention, it is possible to provide a Hall device capable of calculating a correction function with high accuracy with a small number of times of measuring the magnetic sensitivity.

According to a third aspect of the present invention, in the above Hall device, the distribution depth D may satisfy a relational expression of $D \leq 15$.

A fourth aspect of the present invention, in the above Hall device, the distribution depth D may satisfy a relational expression of $4 \leq D$.

According to the fourth aspect of the present invention, it is possible to reduce a residual offset remaining after 2-phase chopper driving.

According to a fifth aspect of the present invention, the above Hall device may further include a silicon oxide layer covering the n-type impurity region.

According to the fifth aspect the present invention, a large depletion layer may not be formed in a contact portion of the silicon oxide layer and the n-type impurity region. Accordingly, it is possible to improve linearity of the temperature characteristics of the magnetic sensitivity of the Hall device.

According to the sixth aspect of the present invention, in the above Hall device, the n-type impurity region may be in contact with the silicon oxide layer.

According to the sixth aspect of the present invention, a large depletion layer may not be formed in a contact portion of the silicon oxide layer and the n-type impurity region. Accordingly, it is possible to improve linearity of the temperature characteristics of the magnetic sensitivity of the Hall device.

According to a seventh aspect of the present invention, in the above Hall device, the n-type impurity concentration N may satisfy a relational expression of $3.0 \times 10^{14} < N$.

According to an eighth aspect of the present invention, there is provided a magnetic sensor including the above Hall device.

According to a ninth aspect of the present invention, the above magnetic sensor may further include: a temperature characteristic storage unit storing information on the temperature characteristics of the Hall device; a correction signal generating unit generating a correction signal for correcting an output of the Hall device on the basis of an output of a temperature sensor and the information on the temperature characteristics of the Hall device; and a signal correcting unit receiving inputs of the correction signal generated by the correction signal generating unit and an output signal of the Hall device input and correcting the output signal of the Hall device on the basis of the correction signal.

According to the ninth aspect of the present invention, it is possible to provide a magnetic sensor having sufficient magnetic field detection accuracy with a small number of test steps.

According to a tenth aspect of the present invention, in the above magnetic sensor, the temperature characteristic storage unit may include: a temperature-proportional coefficient storage unit storing information on a temperature-proportional coefficient of a magnetic sensitivity of the Hall device; and a magnetic sensitivity storage unit storing information on the magnetic sensitivity of the Hall device at a predetermined temperature, wherein the information on the temperature characteristics of the Hall device may include the information on the temperature-proportional coefficient of the magnetic sensitivity of the Hall device and the information on the magnetic sensitivity of the Hall device at the predetermined temperature.

According to the tenth aspect of the present invention, it is possible to accurately correct an output variation of the Hall device due to a temperature variation using the temperature-proportional coefficient of the magnetic sensitivity of the Hall device and the magnetic sensitivity of the Hall device at a predetermined temperature.

According to an eleventh aspect of the present invention, in the above magnetic sensor, the information on the temperature-proportional coefficient of the magnetic sensitivity of the Hall device stored in the temperature-proportional coefficient storage unit may be information on a temperature-proportional coefficient of a constant-current sensitivity of the Hall device, and the information on the magnetic sensitivity of the Hall device at the predetermined temperature stored in the magnetic sensitivity storage unit may be information on the constant-current sensitivity of the Hall device at the predetermined temperature.

According to the eleventh aspect, it is possible to accurately correct an output variation of the Hall device due to a temperature variation using the temperature-proportional coefficient of the magnetic sensitivity of the Hall device and the magnetic sensitivity of the Hall device at a predetermined temperature.

According to a twelfth aspect of the present invention, in the above magnetic sensor, the information on the temperature-proportional coefficient of the magnetic sensitivity of the Hall device may be information calculated from a first magnetic sensitivity of the Hall device measured at a first temperature and a second magnetic sensitivity of the Hall device measured at a second temperature.

According to a thirteenth aspect of the present invention, in the above magnetic sensor, the first magnetic sensitivity may be the constant-current sensitivity of the Hall device measured at the first temperature and the second magnetic sensitivity is the constant-current sensitivity of the Hall device measured at the second temperature.

According to a fourteenth aspect of the present invention, in the above magnetic sensor, the information on the temperature-proportional coefficient of the magnetic sensitivity of the Hall device may be information calculated from the first magnetic sensitivity, the second magnetic sensitivity, and a third magnetic sensitivity of the Hall device measured at a third temperature.

According to a fifteenth aspect of the present invention, in the magnetic sensor according to the fourteenth aspect, the third magnetic sensitivity may be the constant-current sensitivity of the Hall device measured at the third temperature.

According to a sixteenth aspect of the present invention, in the above magnetic sensor, the information on the temperature-proportional coefficient of the magnetic sensitivity of the Hall device may be calculated from the magnetic sensitivities of the Hall device measured at two-point to five-point temperatures.

According to the sixteenth aspect of the present invention, it is possible to provide a magnetic sensor having sufficient magnetic field detection accuracy with a small number of test steps.

According to a seventeenth aspect of the present invention, in the above magnetic sensor, the information on the temperature-proportional coefficient of the magnetic sensitivity of the Hall device may be calculated from the magnetic sensitivities of the Hall device measured at two-point to three-point temperatures.

According to the seventeenth aspect of the present invention, it is possible to provide a magnetic sensor having sufficient magnetic field detection accuracy with a small number of test steps.

According to an eighteenth aspect of the present invention, in the above magnetic sensor, the information on the temperature characteristics of the Hall device may be calculated from the output of the Hall device measured at two-point to five-point temperatures.

According to the eighteenth aspect of the present invention, it is possible to provide a magnetic sensor having sufficient magnetic field detection accuracy with a small number of test steps.

According to a nineteenth aspect of the present invention, in the above magnetic sensor, the information on the temperature characteristics of the Hall device may be calculated from the output of the Hall device measured at two-point to three-point temperatures.

According to the nineteenth aspect of the present invention, it is possible to provide a magnetic sensor having sufficient magnetic field detection accuracy with a small number of test steps.

According to a twentieth aspect of the present invention, the above signal correcting method of the magnetic sensor may include the steps of: acquiring information on the temperature characteristics of the Hall device; generating a correction signal for correcting an output of the Hall device on the basis of an output of a temperature sensor and the information on the temperature characteristics of the Hall device; acquiring an output of the Hall device; and correcting the output signal of the Hall device using the correction signal.

According to the twentieth aspect of the present invention, it is possible to detect a magnetic field with high accuracy with a small number of test steps.

According to a twenty-first aspect of the present invention, in the above signal correcting method of the magnetic sensor, the information on the temperature characteristics of the Hall device may include the information on the temperature-proportional coefficient of the magnetic sensitivity of the Hall device and the information on the magnetic sensitivity of the Hall device at the predetermined temperature, and the step of acquiring the information on the temperature characteristics of the Hall device may include a step of acquiring the information on the temperature-proportional coefficient of the magnetic sensitivity of the Hall device and the information on the magnetic sensitivity of the Hall device at the predetermined temperature.

According to the twenty-first aspect of the present invention, it is possible to accurately correct an output variation of the Hall device due to a temperature variation using the temperature-proportional coefficient of the magnetic sensitivity of the Hall device and the magnetic sensitivity of the Hall device at a predetermined temperature.

According to a twenty-second aspect of the present invention, in the above signal correcting method of the magnetic sensor, the information on the temperature-proportional coefficient of the magnetic sensitivity of the Hall device may be information on a temperature-proportional coefficient of a constant-current sensitivity of the Hall device, and the information on the magnetic sensitivity of the Hall device at the predetermined temperature may be information on the constant-current sensitivity of the Hall device at the predetermined temperature.

According to the twenty-second aspect of the present invention, it is possible to accurately correct an output variation of the Hall device due to a temperature variation using the temperature-proportional coefficient of the magnetic sensitivity of the Hall device and the magnetic sensitivity of the Hall device at a predetermined temperature.

According to a twenty-third aspect of the present invention, in the above signal correcting method of the magnetic sensor, the information on the temperature-proportional coefficient of the magnetic sensitivity of the Hall device may be information calculated from a first magnetic sensitivity of the Hall device measured at a first temperature and a second magnetic sensitivity of the Hall device measured at a second temperature.

According to a twenty-fourth aspect of the present invention, in the above signal correcting method of the magnetic sensor, the first magnetic sensitivity may be the constant-current sensitivity of the Hall device measured at the first temperature and the second magnetic sensitivity may be the constant-current sensitivity of the Hall device measured at the second temperature.

According to a twenty-fifth aspect of the present invention, in the above signal correcting method of the magnetic sensor, the information on the temperature-proportional coefficient of the magnetic sensitivity of the Hall device may be information calculated from the first magnetic sensitivity, the second magnetic sensitivity, and a third magnetic sensitivity of the Hall device measured at a third temperature.

According to a twenty-sixth aspect of the present invention, in the above signal correcting method of the magnetic sensor, the third magnetic sensitivity may be the constant-current sensitivity of the Hall device measured at the third temperature.

According to a twenty-seventh aspect of the present invention, in the above signal correcting method of the magnetic sensor, the information on the temperature-proportional coefficient of the magnetic sensitivity of the Hall device may be calculated from the magnetic sensitivities of the Hall device measured at two-point to five-point temperatures.

According to the twenty-seventh aspect of the present invention, it is possible to detect a magnetic field with high accuracy with a small number of test steps.

According to a twenty-eighth aspect of the present invention, in the above signal correcting method of magnetic sensor, the information on the temperature-proportional coefficient of the magnetic sensitivity of the Hall device may be calculated from the magnetic sensitivities of the Hall device measured at two-point to three-point temperatures.

According to the twenty-eighth aspect of the present invention, it is possible to detect a magnetic field with high accuracy with a small number of test steps.

According to a twenty-ninth aspect of the present invention, in the above signal correcting method of magnetic sensor, the information on the temperature characteristics of the Hall device may be calculated from the output of the Hall device measured at two-point to five-point temperatures.

According to the twenty-ninth aspect of the present invention, it is possible to detect a magnetic field with high accuracy with a small number of test steps.

According to a thirtieth aspect of the present invention, in the above signal correcting method of the magnetic sensor, the information on the temperature characteristics of the Hall device may be calculated from the output of the Hall device measured at two-point to three-point temperatures.

According to the thirtieth aspect of the present invention, it is possible to detect a magnetic field with high accuracy with a small number of test steps.

According to a thirty-first aspect of the present invention, in the above signal correcting method of the magnetic sensor, the step of acquiring the information on the temperature characteristics of the Hall device may include: a step of measuring a first magnetic sensitivity of the Hall device at a first temperature; a step of measuring a second magnetic sensitivity of the Hall device at a second temperature; and a step of acquiring information on the temperature-proportional coefficient of the magnetic sensitivity of the Hall device from the first magnetic sensitivity and the second magnetic sensitivity, wherein the step of generating the correction signal for correcting the output of the Hall device on the basis of the output of the temperature sensor and the information on the temperature characteristics of the Hall device may be a step of generating the correction signal for correcting the output of the Hall device on the basis of the output of the temperature sensor, the information on the temperature-proportional coefficient of the magnetic sensitivity of the Hall device, and the magnetic sensitivity of the Hall device at a predetermined temperature.

According to the thirty-first aspect of the present invention, it is possible to accurately correct an output variation of the Hall device due to a temperature variation using the temperature-proportional coefficient of the magnetic sensitivity of the Hall device and the magnetic sensitivity of the Hall device at a predetermined temperature.

According to a thirty-second aspect of the present invention, in the above signal correcting method of the magnetic sensor according to the twentieth aspect, the step of acquiring the information on the temperature characteristics of the Hall device may include: a step of measuring a first magnetic sensitivity of the Hall device at a first temperature; a step of measuring a second magnetic sensitivity of the Hall device at a second temperature; a step of measuring a third magnetic sensitivity of the Hall device at a third temperature; and a step of acquiring information on the temperature-proportional coefficient of the magnetic sensitivity of the Hall device from the first magnetic sensitivity, the second magnetic sensitivity, and the third magnetic sensitivity, wherein the step of generating the correction signal for correcting the output of the Hall device on the basis of the output of the temperature sensor and the temperature characteristics of the Hall device may be a step of generating the correction signal for correcting the output of the Hall device on the basis of the output of the temperature sensor, the information on the temperature-proportional coefficient of the magnetic sensitivity of the Hall device, and the magnetic sensitivity of the Hall device at a predetermined temperature.

According to the thirty-second aspect of the present invention, it is possible to accurately correct an output variation of the Hall device due to a temperature variation using the temperature-proportional coefficient of the magnetic sensitivity of the Hall device and the magnetic sensitivity of the Hall device at a predetermined temperature.

According to a thirty-third aspect of the present invention, in the above signal correcting method of the magnetic sensor, the magnetic sensitivity may be a constant-current sensitivity.

According to a thirty-fourth aspect of the present invention, in the above signal correcting method of the magnetic sensor according to any one of the twentieth to thirty-third aspects, the step of acquiring the information on the temperature characteristics of the Hall device may be performed prior to shipment, and the step of generating the correction signal for correcting the output of the Hall device on the basis of the output of the temperature sensor and the information on the temperature characteristics of the Hall device, the step of acquiring the output of the Hall device, and the step of correcting the output signal of the Hall device using the correction signal may be performed at the time of measuring a magnetic field.

According to a thirty-fifth aspect of the present invention, there is provided a magnetic sensor including: a Hall device including a p-type impurity region and an n-type impurity region disposed on the p-type impurity region so as to serve as a magnetosensitive portion; a temperature characteristic storage unit storing information on temperature characteristics of the Hall device calculated from an output of the Hall device measured at two-point to five-point temperatures; a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of −40° C. to 150° C.

According to the thirty-fifth aspect of the present invention, it is possible to provide a magnetic sensor having sufficient magnetic field detection accuracy with a small number of test steps.

According to a thirty-sixth aspect of the present invention, there is provided a magnetic sensor including: a Hall device including a p-type impurity region and an n-type impurity region disposed on the p-type impurity region so as to serve as a magnetosensitive portion; a temperature characteristic storage unit storing information on temperature characteristics of the Hall device calculated from an output of the Hall device measured at two-point to three-point temperatures; a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of 25° C. to 150° C.

According to the thirty-sixth aspect of the present invention, it is possible to provide a magnetic sensor having sufficient magnetic field detection accuracy with a small number of test steps.

According to a thirty-seventh aspect of the present invention, in the above magnetic sensor, the temperature characteristic storage unit may store information on temperature characteristics of the Hall device calculated from the output of the Hall device measured at two-point to three-point temperatures.

By employing the configuration according to the thirty-seventh aspect of the present invention, it is possible to provide a magnetic sensor having sufficient magnetic field detection accuracy with a small number of test steps.

Advantageous Effects of the Invention

According to the present invention, it is possible to provide a Hall device which can acquire a correction function having sufficient accuracy with a small number of times of measuring magnetic sensitivity, a magnetic sensor having the Hall device, and a signal correcting method thereof.

BRIEF DESCRIPTION OF THE DRAWINGS

FIG. 1 is a diagram illustrating an example of a drive circuit of a Hall device.

DESCRIPTION OF EMBODIMENTS

Hereinafter, embodiments of the present invention will be described with reference to the accompanying drawings.

The present invention relates to a technique of realizing a high-accuracy magnetic sensor and an object thereof is to realize a method of specifying a concentration and a depth of an n-type impurity region in a magnetosensitive portion of a Hall device to appropriate ranges and correcting temperature characteristics of magnetic sensitivity.

Figure 2A:
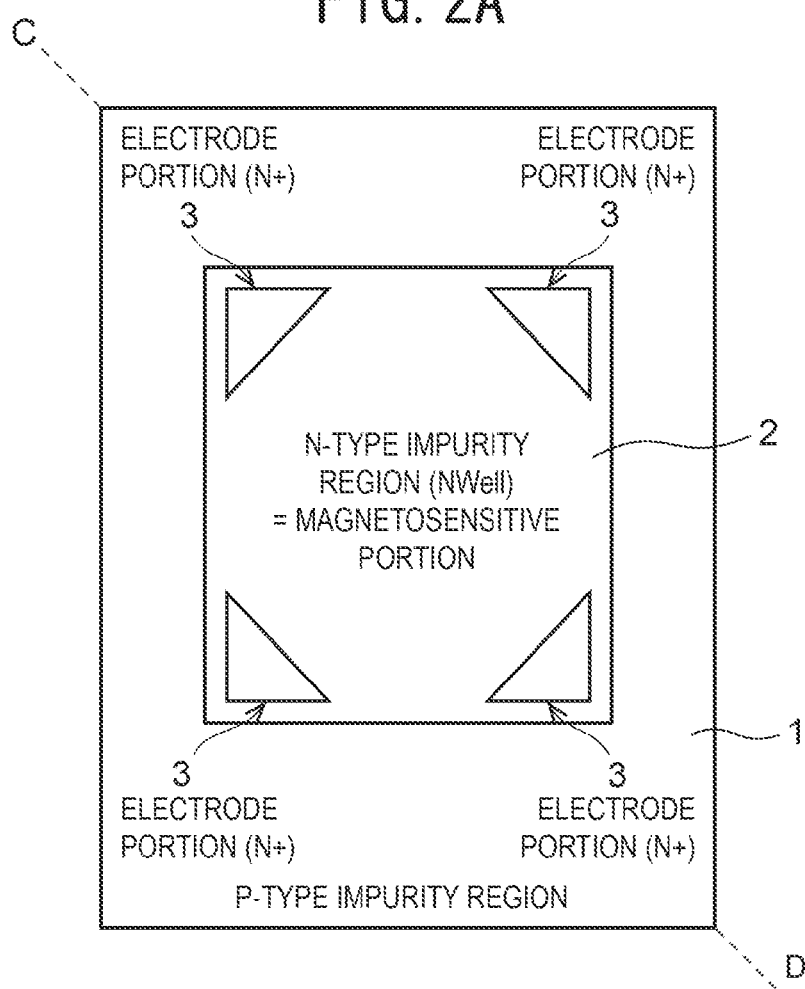
FIGS. 2A and 2B are a plan view (layout) and a cross-sectional view illustrating a Hall device used for a magnetic sensor according to the present invention.
Figure 2B:
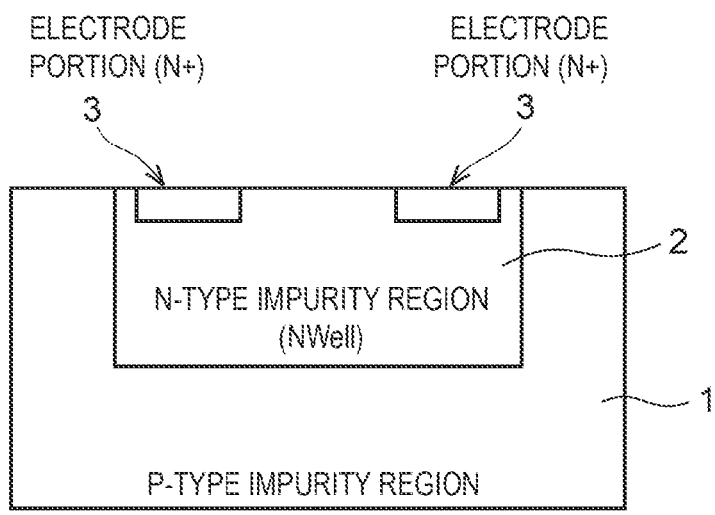

FIGS. 2A and 2B are configuration diagrams illustrating a Hall device according to the present invention, where FIG. 2A is a plan view of the Hall device and FIG. 2B is a cross-sectional view taken along line C-D of FIG. 2A. In the drawings, reference numeral 1 represents a p-type impurity region, reference numeral 2 represents an n-type impurity region, and reference numeral 3 represents an n-type region (electrode portion). The n-type impurity region 2 serves as a magneto-sensitive portion of the Hall device and the n-type region 3 serves as an electrode of the Hall device.

The Hall device according to this embodiment includes the p-type impurity region 1 and the n-type impurity region 2 disposed on the p-type impurity region 1 and serving as a magnetosensitive portion.

In this embodiment, the maximum concentration of an n-type impurity concentration in the n-type impurity region is defined as an n-type impurity concentration N, and the length in the depth direction from a point at which the n-type impurity concentration is a maximum to a point at which the n-type impurity concentration is 1/10 of the n-type impurity concentration N is defined as a distribution depth D. The unit of n-type impurity concentration N is atoms/cm$^3$ and the unit of the distribution depth D is μm.

Figure 4:
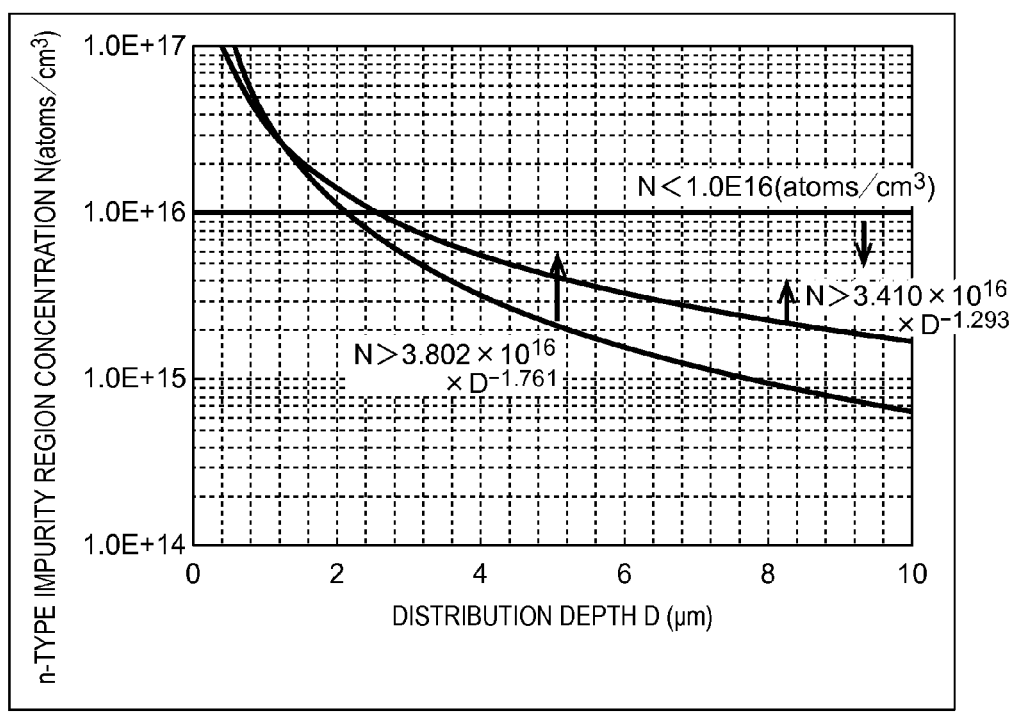
FIG. 4 is a diagram illustrating a relationship between a distribution depth and a concentration of an n-type impurity region.

Secondary ion mass spectrometry (SIMS) is used to measure the maximum concentration N of the n-type impurity concentration and the distribution depth D in the n-type impurity region. This method is a technique of applying ions to a sample surface, detecting ions emitted from the sample surface, and qualitatively and quantitatively measuring components included in the sample by measuring an amount of detected ions for each mass. Through this measurement, for example, it is possible to measure a concentration in the cross-sectional direction of the n-type impurity concentration as illustrated in FIG. 4. "CAMECA IMS-7f" is used as a measuring instrument, and Cs+ as a primary ion species, negative as a secondary ion polarity, and 15.0 kV as an acceleration voltage are set as the measuring conditions.

The n-type impurity concentration N (atoms/cm$^3$) and the distribution depth D (μm) of the n-type impurity region 2 satisfy Expression (3).

$$N<1.0\times10^{16}$$

$$N>3.802\times10^{16}\times D^{-1.761} \quad (3)$$

The n-type impurity concentration N is a maximum concentration of the n-type impurity concentration in the n-type impurity region, and the distribution depth D is a length in the depth direction from a point at which the n-type impurity concentration is the maximum to a point at which the n-type impurity concentration is 1/10 of the n-type impurity concentration N.

In the Hall device according to this embodiment satisfying Expression (3), since the temperature characteristics of the magnetic sensitivity are substantially linear, even a correction function prepared from the result of measurement of the magnetic sensitivity at two temperatures of −40° C. and 150° C. is a correction function having sufficiently high accuracy.

More specifically, even when the magnetic sensitivity in the range of −40° C. to 150° C. is corrected using the correction function prepared from the result of measurement of the magnetic sensitivity at two temperatures of −40° C. and 150° C., the correction residual error can be suppressed to be 1.0% or less.

Figure 3:
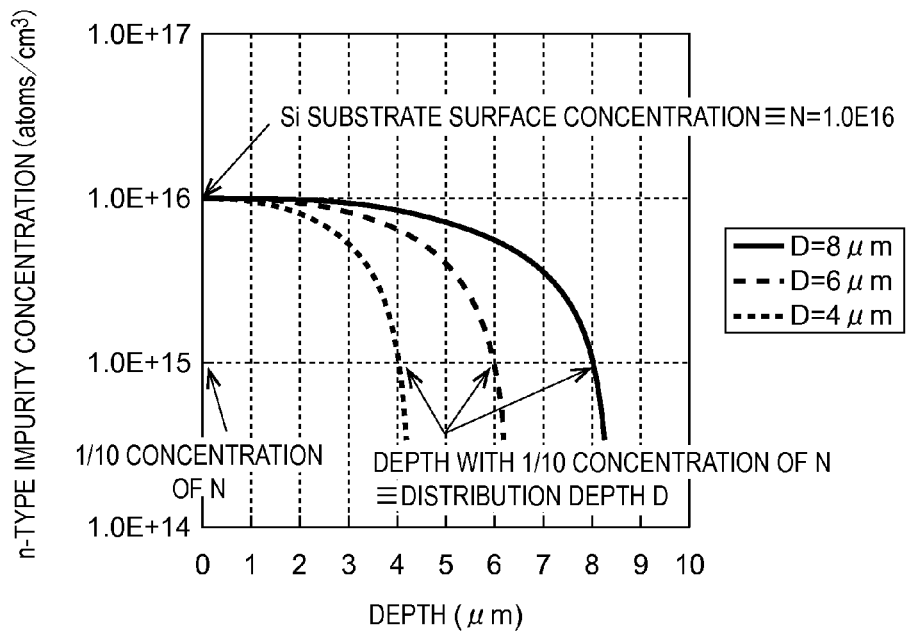
FIG. 3 is a diagram illustrating a relationship between a depth and an n-type impurity concentration.

FIG. 3 is a diagram illustrating a relationship between the distribution depth D and the n-type impurity concentration N. As illustrated in FIG. 3, the n-type impurity concentration N in the n-type impurity region is low in the vicinity of the surface of a silicon substrate and becomes lower in the depth direction. In FIG. 3, all the n-type impurity concentrations N are 1.0×10$^{16}$ (atoms/cm$^3$) and each distribution depth D is 8 μm, 6 μm, and 4 μm.

It is more preferable that the n-type impurity concentration N of the n-type impurity region and the distribution depth D of the n-type impurity concentration satisfy Expression (4).

$$N<1.0\times10^{16}$$

$$N>3.410\times10^{16}\times D^{-1.293} \quad (4)$$

In the Hall device according to this embodiment satisfying Expression (4), since the temperature characteristics of the magnetic sensitivity are substantially linear, even a correction function prepared from the result of measurement of the magnetic sensitivity at two temperatures of 25° C. and 150° C. is a correction function having sufficiently high accuracy.

More specifically, even when the magnetic sensitivity in the range of −40° C. to 150° C. is corrected using the correction function prepared from the result of measurement of the magnetic sensitivity at two temperatures of 25° C. and 150° C., the correction residual error can be suppressed to be 1.0% or less.

FIG. 4 is a diagram illustrating a relationship between the distribution depth and the concentration of the n-type impurity region and illustrates ranges indicated by Expressions (3) and (4).

Basis thereof will be described below.

Figure 5:
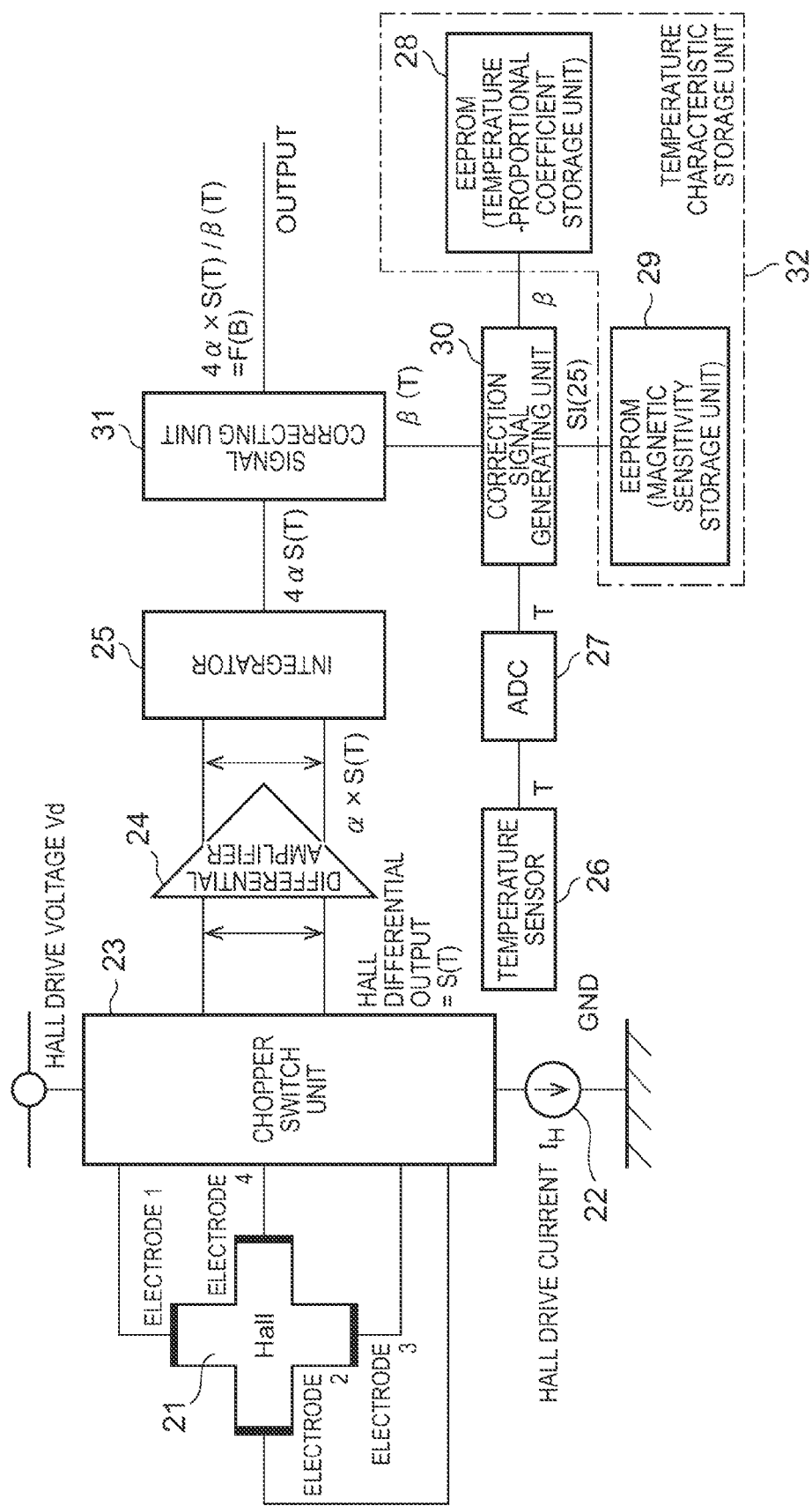
FIG. 5 is a block diagram illustrating an example of a magnetic sensor according to the present invention.

FIG. 5 is a block diagram illustrating an example of a magnetic sensor according to the present invention. In the drawing, reference numeral 21 represents a Hall device, reference numeral 22 represents a Hall drive current source, reference numeral 23 represents a chopper switching unit, reference numeral 24 represents a differential amplifier, reference numeral 25 represents an integrator, reference numeral 26 represents a temperature sensor, reference numeral 27 represents an analog-to-digital converter (ADC), reference numeral 28 represents a temperature-proportional coefficient storage unit (EEPROM), reference numeral 29 represents a magnetic sensitivity storage unit (EEPROM), reference numeral 30 represents a correction signal generating unit, reference numeral 31 represents a signal correcting unit, and reference numeral 32 represents a temperature characteristic storage unit. The temperature characteristic storage unit 32 includes the temperature-proportional coefficient storage unit 28 and the magnetic sensitivity storage unit 29. Information on the temperature characteristics of the Hall device includes information on the temperature-proportional coefficient of the magnetic sensitivity of the Hall device and information on the magnetic sensitivity of the Hall device at a predetermined temperature. Hereinafter, the magnetic sensitivity of the Hall device will be described to be a constant-current sensitivity, but the magnetic sensitivity of the Hall device is not limited to the constant-current sensitivity and may be, for example, a constant-voltage sensitivity.

The magnetic sensor according to the present invention is a magnetic sensor having the Hall device illustrated in FIG. 2. The Hall drive current source 22 is a current source driving the Hall device 21 with constant current. The chopper switch unit 23 is a switch group for driving the Hall device 21 in a 2-phase chopper driving manner or a 4-phase chopper driving manner. By integrating the chopper-driven signal by the use of the integrator 25, the offset of the Hall device 21 can be dynamically removed as expressed by Expression (5).

Phase1 $S_1=SI \times I_H \times B+\text{Offset}_1$

Phase2 $S_2=SI \times I_H \times B+\text{Offset}_2$

Phase3 $S_3=SI \times I_H \times B+\text{Offset}_3$

Phase4 $S_4=SI \times \times B+\text{Offset}_4$ $S_1+S_2+S_3+S_4=4SI \times I_H \times B$ $\text{Offset}_1+\text{Offset}_2+\text{Offset}_3+\text{Offset}_4 \approx 0$ (5)

As a driving order in an example of the 4-phase chopper drive, a Hall drive current is made to flow from Electrode 1 to Electrode 3 and Electrodes 2 and Electrode 4 are connected to the differential amplifier in Phase 1, a Hall drive current is made to flow from Electrode 2 to Electrode 4 and Electrode 3 and Electrode 1 are connected to the differential amplifier 14 in Phase 2, a Hall drive current is made to flow from Electrode 3 to Electrode 1 and Electrode 4 and Electrode 2 are connected to the differential amplifier 24 in Phase 3, and a Hall drive current is made to flow from Electrode 4 to Electrode 2 and Electrode 1 and Electrode 3 are connected to the differential amplifier 24 in Phase 4.

The differential amplifier 24 amplifies (a times) a difference between the outputs of the Hall device 21. The integrator 25 is an integrator operating in synchronization with the chopper driving and adds the output of the differential amplifier 24 in the respective phases.

The temperature sensor 26 is a sensor for measuring the temperature of a silicon substrate and the ADC 27 converts an output signal T of the temperature sensor 26 into a digital signal. The temperature-proportional coefficient storage unit 28 stores a temperature-proportional coefficient of the constant-current sensitivity of the Hall device 21 and the magnetic sensitivity storage unit 29 stores the absolute value (one-point temperature) of the constant-current sensitivity of the Hall device 21. The correction signal generating unit 30 generates a correction signal β(T) of the output of the Hall device 21 using a signal β acquired from the temperature-proportional coefficient storage unit 28, a signal SI (25) acquired from the magnetic sensitivity storage unit 29, and a signal T acquired from the temperature sensor 26. The signal correcting unit 31 corrects the output signal of the Hall device 21 using the correction signal β(T) acquired from the correction signal generating unit 30.

In a linear-corrected magnetic sensor (corresponding to a signal correcting method according to Example 1 to be described later), the correction signal generating unit 30 generates the correction coefficient β(T) on the basis of a slope β calculated from a first constant-current sensitivity SI25 measured at a first temperature of 25° C. and a second constant-current sensitivity SI150 measured at a second temperature of 150° C.

In a three-point corrected magnetic sensor (corresponding to a signal correcting method according to Example 2 to be described later), the correction signal generating unit 30 generates the correction coefficient β(T) on the basis of a first slope β1 and a second slope β2 calculated from a first constant-current sensitivity SI25 measured at a first temperature of 25° C., a second constant-current sensitivity SI150 measured at a second temperature of 150° C., and a third constant-current sensitivity SI-40 measured at a third temperature of −40° C.

In a 2-phase driven magnetic sensor (corresponding to a signal correcting method according to Example 3 to be described later), the chopper switch unit 23 is driven in two phases.

In a slope-corrected magnetic sensor (corresponding to a signal correcting method according to Example 4 to be described later), the correction signal generating unit 30 determines a slope β calculated from a first constant-current sensitivity SI25 measured at a first temperature of 25° C. and a second constant-current sensitivity SI150 measured at a second temperature of 150° C. in advance and generates the correction coefficient β(T) on the basis of the first constant-current sensitivity SI25 measured at the first temperature of 25° C. and the previously determined slope β.

Figure 6:
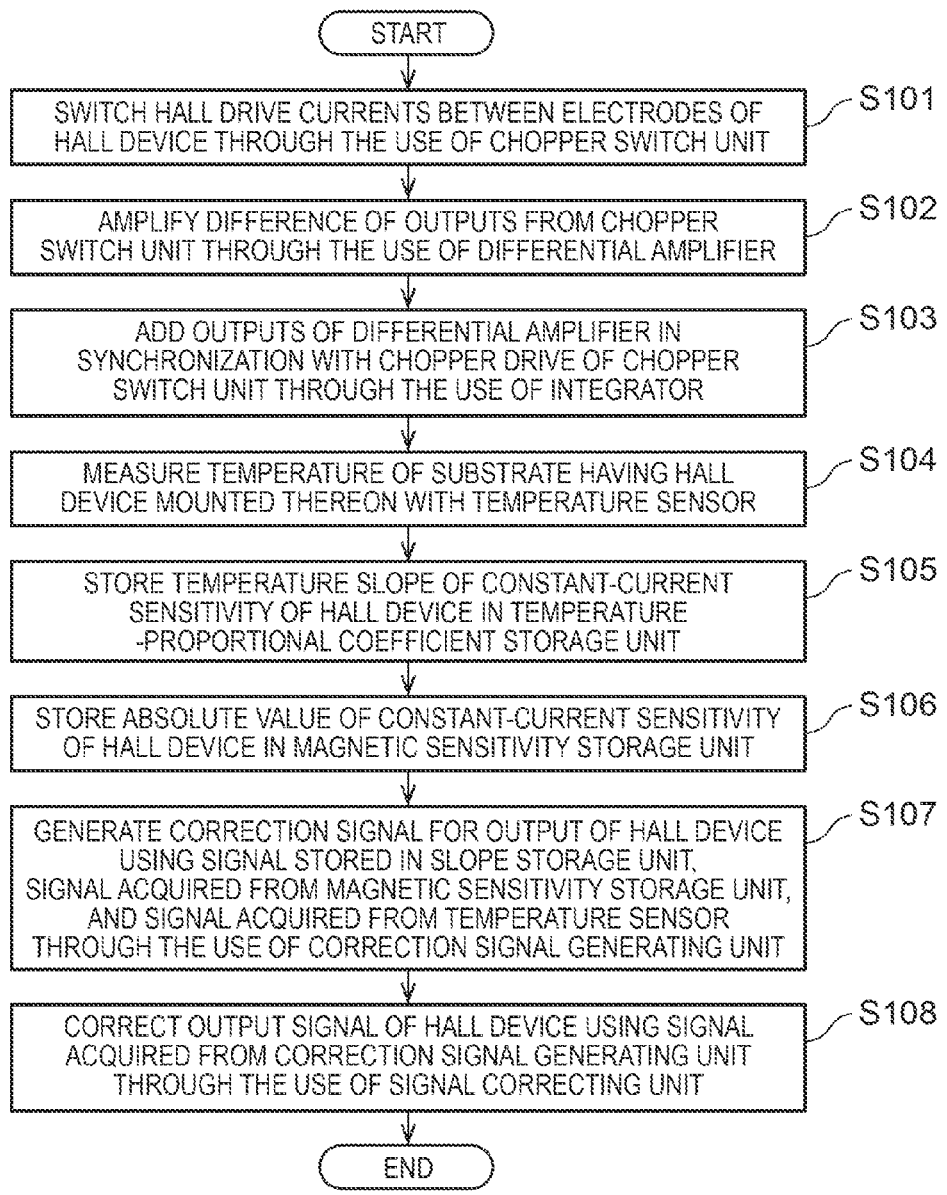
FIG. 6 is a flowchart illustrating an embodiment of a signal correcting method of a magnetic sensor according to the present invention illustrated in FIG. 5.

FIG. 6 is a flowchart illustrating an embodiment of a signal correcting method of the magnetic sensor according to the present invention illustrated in FIG. 5. The signal correcting method of the magnetic sensor according to the present invention is a signal correcting method of a magnetic sensor including the Hall device illustrated in FIG. 2.

The signal correcting method includes a step S101 of switching the Hall drive current between the electrodes of the Hall device 21, by the chopper switch unit 23, a step S102 of amplifying the difference between the outputs of the chopper switch unit 23, by the differential amplifier 24, and a step S103 of adding the output of the differential amplifier 24 in synchronization with the chopper driving of the chopper switch unit 23, by the integrator 25.

The signal correcting method further includes a step S104 of measuring the temperature of the substrate on which the Hall device is mounted, by the temperature sensor 26, a step S105 of storing the temperature-proportional coefficient of the constant-current sensitivity of the Hall device 21, by temperature-proportional coefficient storage unit 28, and a step S106 of storing the absolute value of the constant-current sensitivity of the Hall device 21, by magnetic sensitivity storage unit 29.

The signal correcting method further includes a step S107 of generating the correction signal β(T) of the outputs of the Hall device 21 using the signal β acquired from the temperature-proportional coefficient storage unit 28, the signal SI25 acquired from the magnetic sensitivity storage unit 29, and the signal T acquired from the temperature sensor 26, by the correction signal generating unit 30 and a step S108 of correcting the output signal of the Hall device 21 using the signal β(T) acquired from the correction signal generating unit 30, by the signal correcting unit 31.

By employing the signal correcting methods to be described below, as the methods are simplified as much as possible, the circuit scale is reduced and the EEPROM is reduced, thereby suppressing cost. The signal correction to be described below includes correction of physical quantities based on a Hall electromotive force. That is, the physical quantities based on the Hall electromotive force include a Hall electromotive force signal $V_H$, a constant-current sensitivity SI(T), the Hall drive current $I_H$, the magnetic field B, and quantities proportional to the physical quantities.

Example 1

Figure 7:
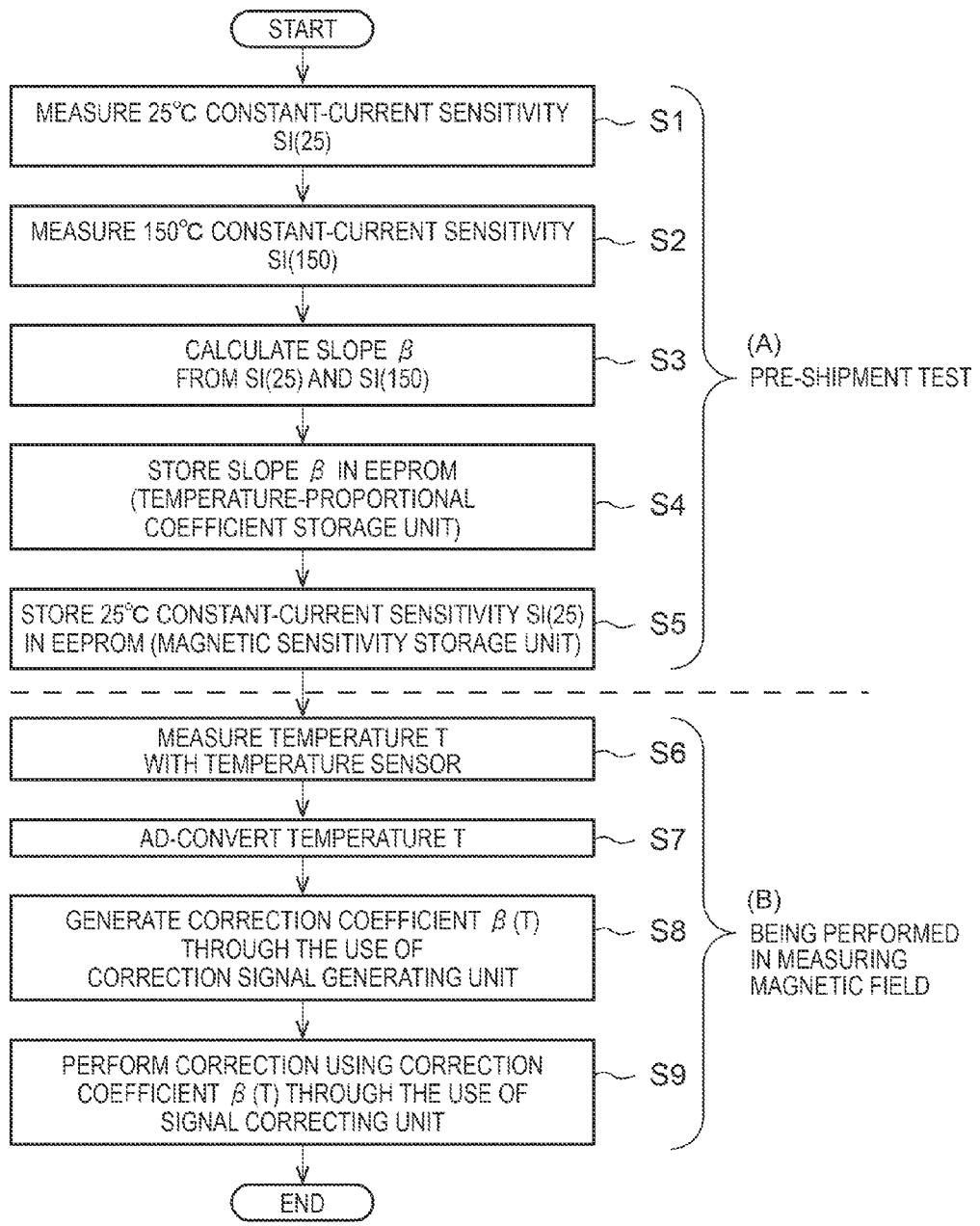
FIG. 7 is a flowchart illustrating Example 1 of a signal correcting method of a magnetic sensor according to the present invention illustrated in FIG. 5.

FIG. 7 is a flowchart illustrating Example 1 of the signal correcting method of the magnetic sensor according to the present invention illustrated in FIG. 5 and illustrates a flow of determination of a correction coefficient and correction. In Example 1, a correction method of measuring the constant-current sensitivity at 25° C. and 150° C. and performing two-point linear approximation in a pre-shipment inspection is employed. The signal correcting method of the magnetic sensor according to Example 1 includes a process (A) of performing a pre-shipment test (output inspection) and a process (B) performed at the time of measuring a magnetic field.

In the process (A) of performing a pre-shipment test, first, a first constant-current sensitivity SI25 at a first temperature of 25° C. is measured (step S1). Then, a second constant-current sensitivity SI150 at a second temperature of 150° C. is measured (step S2). Then, a slope β is calculated from the first constant-current sensitivity SI25 and the second constant-current sensitivity SI150 (step S3). Then, the slope β is stored in the temperature-proportional coefficient storage unit 28 (step S4). Then, the first constant-current sensitivity SI25 is stored in the magnetic sensitivity storage unit 29 (step S5).

In the process (B) performed at the time of measuring a magnetic field, first, a temperature T is measured by the temperature sensor 26 (step S6). Then, the temperature T is AD-converted (step S7). Then, a correction coefficient β(T) is generated by the correction signal generating unit 30 (step S8). Then, an output signal of the Hall device 21 is corrected using the correction coefficient β(T) by the signal correcting unit 31 (step S9). That is, the process (B) performed at the time of measuring a magnetic field includes a step of generating a correction signal for correcting the output of the Hall device on the basis of the output of the temperature sensor 26 and the information on the temperature characteristics of the Hall device, by the correction signal generating unit 30 and a step of correcting the output signal of the Hall device using the correction signal, by the signal correcting unit 31.

β can be calculated from the constant-current sensitivities at 25° C. and 150° C. as expressed by Expression (6).

$$SI(25) \quad : \text{constant-current sensitivity at } 25°C \quad (6)$$

$$SI(150) \quad : \text{constant-current sensitivity at } 150°C$$

$$\beta = \frac{SI(150) - SI(25)}{(150 - 25)}$$

β(T) generated by the correction signal generating unit 30 can be calculated using Expression (7). The output signal F(B) can be calculated using Expression (8).

$$\beta(T) = SI(25) \times \beta \times (T - 25) \quad (7)$$

$$S(T) = SI(T) \times I_H \times B \quad (8)$$

$$F(B) = \frac{4\alpha S(T)}{\beta(T)} = \frac{4\alpha SI(T) \times I_H}{SI(25) \times \beta \times (T - 25)} B$$

When the temperature characteristics of the constant-current sensitivity are linear with respect to the temperature, the output signal F(B) is a value proportional to the magnetic field B but not depending on the constant-current sensitivity as expressed by Expression (9). Therefore, it is possible to accurately calculate the magnetic field B without depending on the variation of the constant-current sensitivity SI of the Hall device.

$$S(T) = SI(T) \times I_H \times B \quad (9)$$

$$SI(T) = SI(25) \times \beta \times (T - 25)$$

$$F(B) = \frac{4\alpha S(T)}{\beta(T)} = \frac{4\alpha SI(T) \times I_H}{SI(25) \times \beta \times (T - 25)} B = 4\alpha I_H B$$

In Expressions (7) to (9), β(T), S(T), SI(T), and F(B) are calculated with the temperature of 25° C. as a reference, but the reference temperature is not limited to 25° C. and an arbitrary temperature may be set as the reference temperature.

Figure 8:
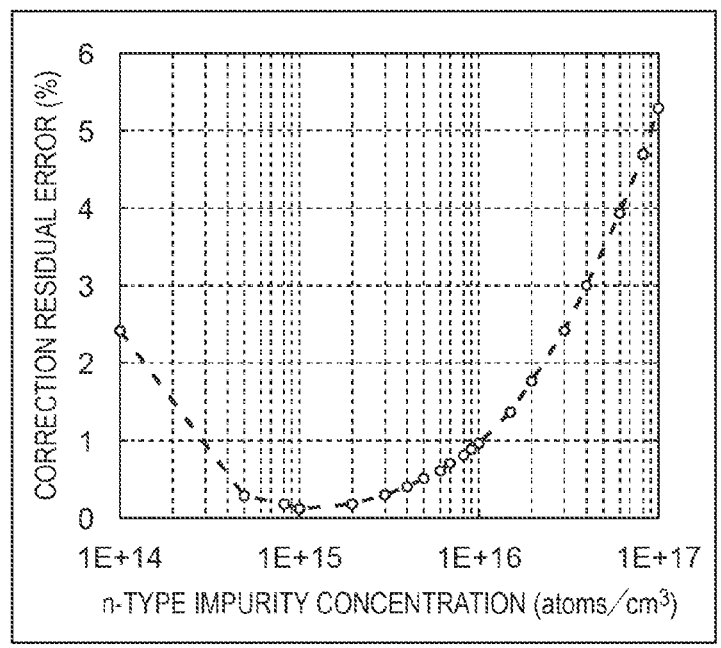
FIG. 8 is a diagram illustrating a relationship of a linear approximation error with respect to an n-type impurity concentration.

The block diagram illustrated in FIG. 5 and the signal correcting method illustrated in FIG. 7 are carried out using Hall devices having different n-type impurity concentrations and the correction residual error is calculated. The results are illustrated in FIG. 8. The distribution depth D of the Hall devices used in FIG. 8 is equal to or more than 10 μm.

FIG. 8 is a diagram illustrating a relationship of the correction residual error with respect to the n-type impurity concentration.

In high-accuracy magnetic sensors commercially available these days, the correction residual error ranges from about 1.8% to 2.0%. In the future, the correction residual error calculated by higher-accuracy magnetic sensors is thought to be about 1.0%. From the result illustrated in FIG. 8, it can be seen that the error is 1% or less as a result of measuring the magnetic field B using the block diagram illustrated in FIG. 5 and the signal correcting method illustrated in FIG. 7 when the n-type impurity concentration satisfies $3.0 \times 10^{14} < N < 1.0 \times 10^{16}$ (atoms/cm$^3$). That is, the magnetic sensitivity of the Hall device in a region in which the n-type impurity concentration satisfies $3.0 \times 10^{14} < N < 1.0 \times 10^{16}$ (atoms/cm$^3$) has strong linearity with respect to the temperature.

When it is necessary to suppress the error to be 1% or less using the Hall device with the n-type impurity concentration of $1.0 \times 10^{16}$ (atoms/cm$^3$) or more, the correction residual error is large in linear approximation and thus the correction of performing measurement at plural temperatures prior to shipment and performing polygonal line approximation of plural temperature regions is necessary as described in Patent Document 3. The pre-shipment measurement at plural temperatures causes an increase in test cost and the polygonal line approximation of plural temperature regions causes an increase in circuit scale.

The reason why linearity of the magnetic sensitivity of the Hall device with respect to the temperature is improved by setting the n-type impurity concentration to satisfy $3.0 \times 10^{14} < N < 1.0 \times 10^{16}$ (atoms/cm$^3$) will be described below. The magnetic sensitivity of the Hall device can be expressed by Expression (10).

$$SI = G \frac{\gamma_H(T)}{q \times d(T) \times n(T)} \quad (10)$$

G is called a geometrical factor and is a parameter determined depending on the shape of the Hall device. $\gamma_H(T)$ represents a Hall scattering factor, d(T) represents an effective thickness of the Hall device, n(T) represents a carrier density of a conduction band, and q represents a charge of electrons. The reason why the magnetic sensitivity of the Hall device exhibits a second-order characteristic is that the carrier density n (T) of the conduction band exhibits a second-order characteristics, but the influence of n (T) can be reduced by reducing the n-type impurity concentration. When the n-type impurity concentration is reduced, the influence of n(T) is reduced and the influence of the Hall scattering factor $\gamma_H(T)$ is dominant. Since the Hall scattering factor $\gamma_H(T)$ has strong linearity, it is possible to improve the linearity of the magnetic sensitivity of the Hall device by reducing the n-type impurity concentration.

By setting the n-type impurity concentration to $3.0 \times 10^{14} < N < 1.0 \times 10^{16}$ (atoms/cm$^3$), the correction residual error becomes 1.0%. However, by reducing the n-type impurity concentration, the influence of a depletion layer increases. Since the Hall device has a structure in which the n-type impurity region is surrounded with the p-type impurity region, an np junction area is present in all directions around the magnetosensitive portion and thus a depletion layer is formed. Since the depletion layer diffuses into an area having a low concentration, the influence of the depletion increases by reducing the n-type impurity concentration of the magnetorsensitive portion.

Figure 9:
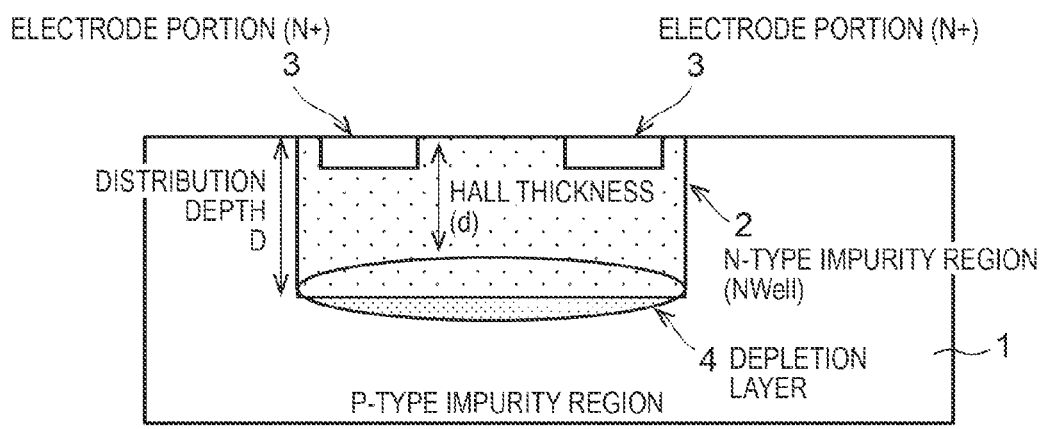
FIG. 9 is a schematic cross-sectional view of a Hall device in operation.

FIG. 9 is a schematic cross-sectional view of the Hall device in operation and is a diagram illustrating a relationship between the distribution depth and the depletion layer in the n-type impurity region. In the drawing, reference numeral 4 represents the depletion layer. Particularly, the influence of a deep portion of the n-type impurity region 2 illustrated in FIG. 9 is great. As expressed by Expression (10), the constant-current sensitivity is inversely proportional to a Hall thickness d illustrated in FIG. 9. The Hall thickness d is obtained by subtracting the thickness of the depletion layer 4 from the distribution depth D of the n-type impurity concentration. That is, the Hall thickness d decreases as the depletion layer 4 is enlarged, and the Hall thickness d increases as the depletion layer 4 is reduced.

The influence of the depletion layer 4 varies depending on the driving method, but it is assumed that the driving method generally used and illustrated in FIG. 1 is used. As the temperature rises, the resistance value of the Hall device also increases. In the constant-current drive illustrated in FIG. 1, as the resistance value of the Hall device increases, the potential of point B in FIG. 1 falls.

The average potential of the magnetosensitive portion of the Hall device can be considered to be the average of the potentials of point A and point B in FIG. 1. Accordingly, as the temperature rises, the average potential of the magnetosensitive portion falls. The depletion layer 4 is formed in an np junction region and the width of the depletion layer 4 is determined depending on a potential difference between the potential of an n region and the potential of a p region.

In the deep portion of the n-type impurity region 2 illustrated in FIG. 9, the p region has the potential of the Si substrate, which is GND (0 V) without depending on the temperature. The n region has the average potential of the magnetosensitive portion, which varies depending on the temperature. That is, since the potential difference between the n region and the p region varies depending on the temperature, the width of the depletion layer 4 also varies depending on the temperature. Since the width of the depletion layer 4 varies, the Hall thickness d also varies depending on the temperature. Accordingly, the constant-current sensitivity is affected by the temperature dependency of the Hall thickness d.

When the distribution depth D of the n-type impurity region 2 is sufficiently large, the Hall thickness d is hardly affected by the variation in width of the depletion layer 4. However, when the distribution depth D is small, the Hall thickness d varies with the variation of the depletion layer 4, thereby deteriorating the linearity of the constant-current sensitivity with respect to the temperature.

When the temperature correction of a product with a temperature range of −40° C. to 150° C. in its specification is performed using linear approximation of two points, two methods can be used which include a method of measuring two points of −40° C. and 150° C. and performing linear approximation and a method of measuring two points of 25° C. and 150° C. and performing linear approximation. By employing the method of measuring two points of −40° C. and 150° C. and performing linear approximation, it is possible to detect a magnetic field with high accuracy in the whole temperature range in the specification. On the other hand, when the method of measuring two points of 25° C. and 150° C. and performing linear approximation is used, cooling is not necessary, thereby reducing the cost.

When two points of −40° C. and 150° C. are measured and the linear approximation is performed, an area in which the correction residual error is equal to or less than 1% is calculated. The area is expressed by Expression (11). By specifying the concentration N and the distribution depth D of the n-type impurity region to this range, it is possible to detect a magnetic field with high accuracy, by the linear approximation.

$$N<1.0\times10^{16}$$

$$N>3.802\times10^{16}\times D^{-1.761} \tag{11}$$

When two points of 25° C. and 150° C. are measured and the linear approximation is performed, an area in which the correction residual error is equal to or less than 1% is calculated. The area is expressed by Expression (12). By specifying the concentration N and the distribution depth D of the n-type impurity region to this range, it is possible to detect a magnetic field with high accuracy, by the linear approximation. The area of Expression (12) is smaller than the area of Expression (11). By employing the area of Expression (12), it is possible to detect a magnetic field with high accuracy at a lower cost.

$$N<1.0\times10^{16}$$

$$N>3.410\times10^{16}\times D^{-1.293} \tag{12}$$

Specific examples of the results inside and outside the above-mentioned range will be described below (Example 6; see Tables 1 to 19).

Figure 10:
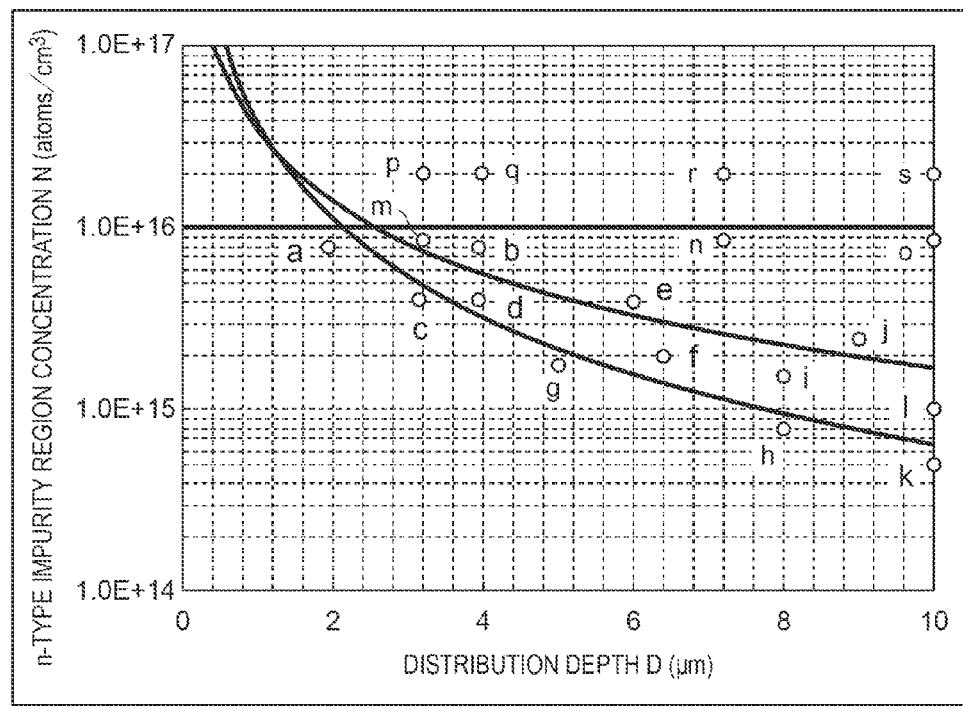
FIG. 10 is a diagram illustrating a relationship between a distribution depth and a concentration of an n-type impurity region.

FIG. 10 is a diagram illustrating a relationship between the distribution depth and the concentration N of the n-type impurity region. The impurity concentration N and the distribution depth D of a to s illustrated in Tables 1 to 19 correspond to a to s in FIG. 10. In Tables 1 to 19, the first column represents the temperature, the second column represents the constant-current sensitivity (normalized with 25° C.) before correction, the third column represents the constant-current sensitivity after correcting the constant-current sensitivity before correction using the temperature-proportional coefficient of the constant-current sensitivity acquired from the result of measuring the magnetic sensitivity at two points of −40° C. and 150° C., and the fourth column represents the constant-current sensitivity after correcting the constant-current sensitivity before correction using the temperature-proportional coefficient of the constant-current sensitivity acquired from the result of measuring the magnetic sensitivity at two points of 25° C. and 150° C.

In Tables 1 to 19, concentration N represents the n-type impurity concentration N and depth D represents the distribution depth D.

The bottom row represents the correction residual error calculated in the form of ±0%.

For example, in Table 1, the maximum magnetic sensitivity $SI_{MAX}$ of the fourth column (linear approximation of 25° C. to 150° C.) is 1.004 and the minimum magnetic sensitivity $SI_{MIN}$ is 0.962.

Therefore, the correction residual error $E_R$ is (1.004−0.962)/2.

As can be seen from FIG. 10, point a is a point out of the range of the present invention. The actually-calculated correction residual error is equal to or more than ±1%. A point at which the depth is doubled with the concentration N kept constant is point b. When the linear approximation is performed with −40° C. to 150° C. and when the linear approximation is performed with 25° C. to 150° C., the correction residual error is equal to or less than ±1%.

Point c to Point e represent the results when the distribution depth D is changed with the concentration N kept constant. Point c is out of the range, point d is within the range of Expression (11), and point e is within the range of Expression (12). The correction residual error is equal to or more than ±1% at point c, is equal to or less than ±1% at point d when linear approximation is performed with −40° C. to 150° C., and is equal to or less than ±1% at point e when linear approximation is performed with 25° C. to 150° C. Regarding point f, the correction residual error is equal to or less than 1% when linear approximation is performed with −40° C. to 150° C., but the correction residual error is equal to or more than 1% when linear approximation is performed with 25° C. to 150° C.

Point g is a point out of the range of the present invention. The correction residual error at that point is equal to or more than ±1%. It can be seen that the correction residual error of point h is equal to or more than ±1%. Point i represents the result when the concentration N is higher than that of point h. The correction residual error of that point is equal to or less than ±1% when linear approximation is performed with −40° C. to 150° C. It can be seen that the correction residual error of point j is equal to or less than ±1% when linear approximation is performed with −40° C. to 150° C. and when linear approximation is performed with 25° C. to 150° C.

It can be seen that point k and point l are within (L) and out of (K) the range of the present invention in a region having the largest distribution depth D and a low concentration.

Points m to o are points at which the concentration N is high within the range of the present invention. As shown in Tables 13 to 15, the correction residual error thereof is equal to or less than ±1%.

Points p to s are points at which the concentration N is high out of the range of the present invention. As shown in Tables 16 to 19, the correction residual error is larger than ±1%.

From these results, it can be seen that the correction residual error after the linear approximation varies within and out of the ranges of Expressions (11) and (12).

TABLE 1 a
Concentration N 8.0E+15 atoms/cm$^3$
Depth D 2.0 μm

| Temperature (° C.) | SI(T) | Linear approximation with −40° C. to 150° C. | Linear approximation with 25° C. to 150° C. |
|---|---|---|---|
| −40 | 1.085 | 0.975 | 0.962 |
| −10 | 1.052 | 0.993 | 0.986 |
| 25 | 1.000 | 1.000 | 1.000 |
| 85 | 0.891 | 0.992 | 1.004 |
| 100 | 0.862 | 0.988 | 1.003 |
| 125 | 0.813 | 0.981 | 1.001 |
| 150 | 0.764 | 0.975 | 1.000 |
| Correction residual error (±%) | | 1.249 | 2.095 |

TABLE 2 b
Concentration N 8.0E+15 atoms/cm$^3$
Depth D 4.0 μm

| Temperature (° C.) | SI(T) | Linear approximation with −40° C. to 150° C. | Linear approximation with 25° C. to 150° C. |
|---|---|---|---|
| −40 | 0.978 | 0.996 | 0.994 |
| −10 | 0.988 | 0.998 | 0.996 |
| 25 | 1.000 | 1.000 | 1.000 |
| 85 | 1.018 | 1.001 | 1.003 |
| 100 | 1.022 | 1.001 | 1.003 |
| 125 | 1.027 | 0.999 | 1.002 |
| 150 | 1.031 | 0.996 | 1.000 |
| Correction residual error (±%) | | 0.274 | 0.482 |

TABLE 3 c
Concentration N 4.0E+15 atoms/cm$^3$
Depth D 3.2 μm

| Temperature (° C.) | SI(T) | Linear approximation with −40° C. to 150° C. | Linear approximation with 25° C. to 150° C. |
|---|---|---|---|
| −40 | 1.089 | 0.975 | 0.962 |
| −10 | 1.055 | 0.993 | 0.986 |
| 25 | 1.000 | 1.000 | 1.000 |
| 85 | 0.885 | 0.991 | 1.003 |
| 100 | 0.885 | 0.987 | 1.002 |
| 125 | 0.804 | 0.980 | 1.001 |
| 150 | 0.755 | 0.975 | 1.000 |
| Correction residual error (±%) | | 1.259 | 2.066 |

TABLE 4 d
Concentration N 4.0E+15 atoms/cm$^3$
Depth D 4.0 μm

| Temperature (° C.) | SI(T) | Linear approximation with −40° C. to 150° C. | Linear approximation with 25° C. to 150° C. |
|---|---|---|---|
| −40 | 0.999 | 0.981 | 0.971 |
| −10 | 1.002 | 0.992 | 0.987 |
| 25 | 1.000 | 1.000 | 1.000 |
| 85 | 0.982 | 0.999 | 1.009 |
| 100 | 0.975 | 0.997 | 1.008 |
| 125 | 0.961 | 0.990 | 1.005 |
| 150 | 0.945 | 0.981 | 1.000 |
| Correction residual error (±%) | | 0.966 | 1.903 |

TABLE 5 e

Concentration N 4.0E+15 atoms/cm$^3$
Depth D 6.0 μm

| Temperature (° C.) | SI(T) | Linear approximation with −40° C. to 150° C. | Linear approximation with 25° C. to 150° C. |
|---|---|---|---|
| −40 | 0.974 | 0.992 | 0.988 |
| −10 | 0.986 | 0.996 | 0.994 |
| 25 | 1.000 | 1.000 | 1.000 |
| 85 | 1.018 | 1.001 | 1.005 |
| 100 | 1.021 | 1.000 | 1.004 |
| 125 | 1.025 | 0.997 | 1.003 |
| 150 | 1.028 | 0.992 | 1.000 |
| Correction residual error (±%) | | 0.431 | 0.822 |

TABLE 6 f

Concentration N 2.0E+15 atoms/cm$^3$
Depth D 6.4 μm

| Temperature (° C.) | SI(T) | Linear approximation with −40° C. to 150° C. | Linear approximation with 25° C. to 150° C. |
|---|---|---|---|
| −40 | 0.992 | 0.981 | 0.971 |
| −10 | 0.998 | 0.992 | 0.987 |
| 25 | 1.000 | 1.000 | 1.000 |
| 85 | 0.990 | 1.000 | 1.009 |
| 100 | 0.985 | 0.997 | 1.008 |
| 125 | 0.974 | 0.990 | 1.005 |
| 150 | 0.961 | 0.981 | 1.000 |
| Correction residual error (±%) | | 0.942 | 1.862 |

TABLE 7 g

Concentration N 1.7E+15 atoms/cm$^3$
Depth D 5.0 μm

| Temperature (° C.) | SI(T) | Linear approximation with −40° C. to 150° C. | Linear approximation with 25° C. to 150° C. |
|---|---|---|---|
| −40 | 1.268 | 1.029 | 1.044 |
| −10 | 1.150 | 1.022 | 1.030 |
| 25 | 1.000 | 1.000 | 1.000 |
| 85 | 0.764 | 0.984 | 0.970 |
| 100 | 0.713 | 0.989 | 0.971 |
| 125 | 0.636 | 1.004 | 0.981 |
| 150 | 0.569 | 1.029 | 1.000 |
| Correction residual error (±%) | | 2.229 | 3.672 |

TABLE 8 h

Concentration N 8.0E+14 atoms/cm$^3$
Depth D 8.0 μm

| Temperature (° C.) | SI(T) | Linear approximation with −40° C. to 150° C. | Linear approximation with 25° C. to 150° C. |
|---|---|---|---|
| −40 | 1.100 | 0.975 | 0.962 |
| −10 | 1.062 | 0.994 | 0.987 |
| 25 | 1.000 | 1.000 | 1.000 |
| 85 | 0.873 | 0.989 | 1.001 |
| 100 | 0.840 | 0.985 | 1.000 |
| 125 | 0.786 | 0.979 | 0.999 |
| 150 | 0.734 | 0.975 | 1.000 |
| Correction residual error (±%) | | 1.252 | 1.954 |

TABLE 9 i

Concentration N 1.5E+15 atoms/cm$^3$
Depth D 8.0 μm

| Temperature (° C.) | SI(T) | Linear approximation with −40° C. to 150° C. | Linear approximation with 25° C. to 150° C. |
|---|---|---|---|
| −40 | 0.981 | 0.984 | 0.976 |
| −10 | 0.992 | 0.993 | 0.989 |
| 25 | 1.000 | 1.000 | 1.000 |
| 85 | 1.003 | 1.000 | 1.008 |
| 100 | 1.001 | 0.998 | 1.007 |
| 125 | 0.997 | 0.992 | 1.005 |
| 150 | 0.990 | 0.984 | 1.000 |
| Correction residual error (±%) | | 0.805 | 1.607 |

TABLE 10 j

Concentration N 2.5E+15 atoms/cm$^3$
Depth D 9.0 μm

| Temperature (° C.) | SI(T) | Linear approximation with −40° C. to 150° C. | Linear approximation with 25° C. to 150° C. |
|---|---|---|---|
| −40 | 0.966 | 0.993 | 0.990 |
| −10 | 0.983 | 0.997 | 0.995 |
| 25 | 1.000 | 1.000 | 1.000 |
| 85 | 1.026 | 1.001 | 1.004 |
| 100 | 1.031 | 1.000 | 1.004 |
| 125 | 1.039 | 0.997 | 1.003 |
| 150 | 1.045 | 0.993 | 1.000 |
| Correction residual error (+%) | | 0.361 | 0.687 |

TABLE 11 k

Concentration N 4.8E+14 atoms/cm³
Depth D 10.0 μm

| Temperature (° C.) | SI(T) | Linear approximation with −40° C. to 150° C. | Linear approximation with 25° C. to 150° C. |
|---|---|---|---|
| −40 | 1.238 | 1.019 | 1.029 |
| −10 | 1.134 | 1.016 | 1.021 |
| 25 | 1.000 | 1.000 | 1.000 |
| 85 | 0.783 | 0.985 | 0.976 |
| 100 | 0.735 | 0.988 | 0.977 |
| 125 | 0.662 | 0.999 | 0.984 |
| 150 | 0.597 | 1.019 | 1.000 |
| Correction residual error (±%) | | 1.679 | 2.624 |

TABLE 12

L

Concentration N 1.0E+15 atoms/cm
Depth D 10.0 μm

| Temperature (° C.) | SI(T) | Linear approximation with −40° C. to 150° C. | Linear approximation with 25° C. to 150° C. |
|---|---|---|---|
| −40 | 0.981 | 0.983 | 0.975 |
| −10 | 0.992 | 0.993 | 0.988 |
| 25 | 1.000 | 1.000 | 1.000 |
| 85 | 1.002 | 1.000 | 1.008 |
| 100 | 1.001 | 0.998 | 1.008 |
| 125 | 0.996 | 0.992 | 1.005 |
| 150 | 0.988 | 0.983 | 1.000 |
| Correction residual error (±%) | | 0.836 | 1.667 |

TABLE 13 m

Concentration N 9.0E+15 atoms/cm³
Depth D 3.2 μm

| Temperature (° C.) | SI(T) | Linear approximation with −40° C. to 150° C. | Linear approximation with 25° C. to 150° C. |
|---|---|---|---|
| −40 | 0.998 | 1.004 | 1.006 |
| −10 | 0.996 | 0.999 | 1.001 |
| 25 | 1.000 | 1.000 | 1.000 |
| 85 | 1.010 | 1.004 | 1.002 |
| 100 | 1.012 | 1.005 | 1.002 |
| 125 | 1.015 | 1.005 | 1.002 |
| 150 | 1.016 | 1.004 | 1.000 |
| Correction residual error (±%) | | 0.278 | 0.316 |

TABLE 14 n

Concentration N 9.0E+15 atoms/cm³
Depth D 7.2 μm

| Temperature (° C.) | SI(T) | Linear approximation with −40° C. to 150° C. | Linear approximation with 25° C. to 150° C. |
|---|---|---|---|
| −40 | 0.989 | 1.011 | 1.017 |
| −10 | 0.990 | 1.002 | 1.005 |
| 25 | 1.000 | 1.000 | 1.000 |
| 85 | 1.024 | 1.004 | 0.999 |
| 100 | 1.031 | 1.006 | 0.999 |
| 125 | 1.042 | 1.008 | 1.000 |
| 150 | 1.053 | 1.011 | 1.000 |
| Correction residual error (±%) | | 0.547 | 0.890 |

TABLE 15 o

Concentration N 9.0E+15 atoms/cm³
Depth D 10.0 μm

| Temperature (° C.) | SI(T) | Linear approximation with −40° C. to 150° C. | Linear approximation with 25° C. to 150° C. |
|---|---|---|---|
| −40 | 0.988 | 1.012 | 1.018 |
| −10 | 0.990 | 1.003 | 1.006 |
| 25 | 1.000 | 1.000 | 1.000 |
| 85 | 1.026 | 1.004 | 0.998 |
| 100 | 1.034 | 1.006 | 0.999 |
| 125 | 1.046 | 1.009 | 0.999 |
| 150 | 1.058 | 1.012 | 1.000 |
| Correction residual error (±%) | | 0.596 | 0.989 |

TABLE 16 p

Concentration N 2.0E+16 atoms/cm³
Depth D 3.2 μm

| Temperature (° C.) | SI(T) | Linear approximation with −40° C. to 150° C. | Linear approximation with 25° C. to 150° C. |
|---|---|---|---|
| −40 | 1.023 | 1.024 | 1.036 |
| −10 | 1.005 | 1.006 | 1.012 |
| 25 | 1.000 | 1.000 | 1.000 |
| 85 | 1.009 | 1.008 | 0.996 |
| 100 | 1.012 | 1.011 | 0.997 |
| 125 | 1.019 | 1.017 | 0.998 |
| 150 | 1.026 | 1.024 | 1.000 |
| Correction residual error (±%) | | 1.192 | 2.009 |

TABLE 17 q

Concentration N 2.0E+16 atoms/cm³
Depth D 4.0 µm

| Temperature (° C.) | SI(T) | Linear approximation with −40° C. to 150° C. | Linear approximation with 25° C. to 150° C. |
|---|---|---|---|
| −40 | 1.022 | 1.025 | 1.038 |
| −10 | 1.004 | 1.006 | 1.013 |
| 25 | 1.000 | 1.000 | 1.000 |
| 85 | 1.010 | 1.008 | 0.996 |
| 100 | 1.014 | 1.011 | 0.996 |
| 125 | 1.022 | 1.018 | 0.998 |
| 150 | 1.030 | 1.025 | 1.000 |
| Correction residual error (±%) | | 1.236 | 2.096 |

TABLE 18 r

Concentration N 2.0E+16 atoms/cm³
Depth D 7.2 µm

| Temperature (° C.) | SI(T) | Linear approximation with −40° C. to 150° C. | Linear approximation with 25° C. to 150° C. |
|---|---|---|---|
| −40 | 1.021 | 1.026 | 1.040 |
| −10 | 1.003 | 1.006 | 1.014 |
| 25 | 1.000 | 1.000 | 1.000 |
| 85 | 1.013 | 1.008 | 0.995 |
| 100 | 1.018 | 1.011 | 0.996 |
| 125 | 1.027 | 1.018 | 0.997 |
| 150 | 1.037 | 1.026 | 1.000 |
| Correction residual error (±%) | | 1.301 | 2.227 |

TABLE 19 s

Concentration N 2.0E+16 atoms/cm³
Depth D 10.0 µm

| Temperature (° C.) | SI(T) | Linear approximation with −40° C. to 150° C. | Linear approximation with 25° C. to 150° C. |
|---|---|---|---|
| −40 | 1.020 | 1.026 | 1.040 |
| −10 | 1.003 | 1.007 | 1.014 |
| 25 | 1.000 | 1.000 | 1.000 |
| 85 | 1.013 | 1.008 | 0.995 |
| 100 | 1.019 | 1.011 | 0.995 |
| 125 | 1.028 | 1.018 | 0.997 |
| 150 | 1.039 | 1.026 | 1.000 |
| Correction residual error (±%) | | 1.321 | 2.268 |

As described above, it is preferable that the influence of the depletion layer in a junction of the n-type impurity region and the p-type impurity region be small. Similarly, it is preferable that the influence of the depletion layer on the surface of the Hall device be small or no depletion layer be formed on the surface of the Hall device.

Figure 11:
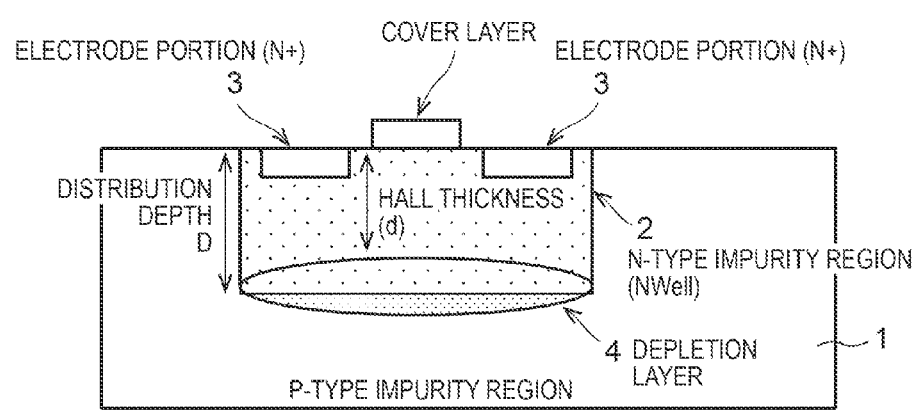
FIG. 11 is a schematic cross-sectional view of a Hall device in operation.

FIG. 11 is a schematic cross-sectional view of a Hall device in operation. As illustrated in FIG. 11, a cover layer is disposed on the surface of the Hall device for the purpose of insulation from an upper layer. In order to set the value of the Hall thickness d to be as large as possible, it is required that the influence of the depletion layer in the junction of the cover layer and the n-type impurity region be small. Accordingly, it is preferable that the cover layer be formed of silicon oxide. A material other than silicon oxide may be used for the cover layer as long as it can insulate the Hall device from the upper layer, but the Hall thickness d is reduced when a depletion layer is formed. When a large depletion layer is formed in the junction of the cover layer and the n-type impurity region, the distribution depth D needs to be set to a large value so as to achieve the same Hall thickness d as when the depletion layer is not formed. Accordingly, silicon oxide not forming a depletion layer can be preferably used for the cover layer of the Hall device.

The n-type impurity region is generally formed by epitaxial growth or thermal diffusion of implants injected into the silicon substrate. In both methods, the manufacturing time needs to be extended so as to achieve a large distribution depth D.

The thermal diffusion of implants varies depending on the type of the implants, the heating temperature, and the heating time. Regarding the type of implants, P (phosphorus) is generally used as the n-type impurity, but the n-type impurity is not limited thereto as long as it can serve as a donor. When a typical manufacturing method is used, the distribution depth is about 15 µm with the heating time of about 1500 minutes.

It is possible to increase the distribution depth by extending the heating time, but from the viewpoint of the manufacturing time, it is preferable that the heating time be equal to or less than 1500 minutes and the distribution depth be equal to or less than 15 µm. From the viewpoint of the manufacturing time, the distribution depth D is preferably equal to or less than 10 µm, more preferably equal to or less than 9 µm, still more preferably equal to or less than 8 µm, and still more preferably equal to or less than 7 µm. The distribution depth D may be equal to or less than 6 µm or may be equal to or less than 5 µm.

In order to reduce the influence of the depletion layer, which is formed between the n-type impurity region and the p-type impurity region, to the magnetic sensitivity, the distribution depth D is preferably equal to or more than 3 µm, more preferably equal to or more than 4 µm, and still more preferably equal to or more than 5 µm.

B (boron) is generally used as the p-type impurity used for the p-type impurity region around the Hall device, but the p-type impurity is not limited thereto as long as it can serve as an acceptor. The concentration of the p-type impurity region is not particularly limited, and can be set to a general impurity concentration of $1.0 \times 10^{14}$ (atoms/cm³) to $1.0 \times 10^{21}$ (atoms/cm³).

From the above-mentioned results, the n-type impurity concentration N and the distribution depth D satisfying Expression (3) can be preferably used to implement a high-accuracy magnetic sensor at a low cost and the n-type impurity concentration N and the distribution depth D satisfying Expression (4) can be more preferably used. The ranges indicated by Expressions (3) and (4) are illustrated in FIG. 4. By performing appropriate correction such as two-point temperature linear approximation on the Hall device manufactured within the ranges illustrated in FIG. 4, it is possible to implement a magnetic sensor with high magnetic field detection accuracy at a low cost.

Example 2

In Example 2, by performing restriction of the n-type impurity concentration N and the distribution depth D and multi-point correction, it is possible to reduce the correction residual error after correction in comparison with the multi-point correction in the Hall device according to the related art.

Example 1 has employed the method of performing correction using two-point linear approximation in the pre-shipment inspection. When high-accuracy correction is necessary, it is effective to measure the constant-current sensitivity with three-point temperatures of −40° C., 25° C., and 150° C. and to perform correction using three-point polygonal line approximation in the pre-shipment inspection. The block diagram used to describe a magnetic sensor according to Example 2 is the same as used in Example 1.

Figure 12:
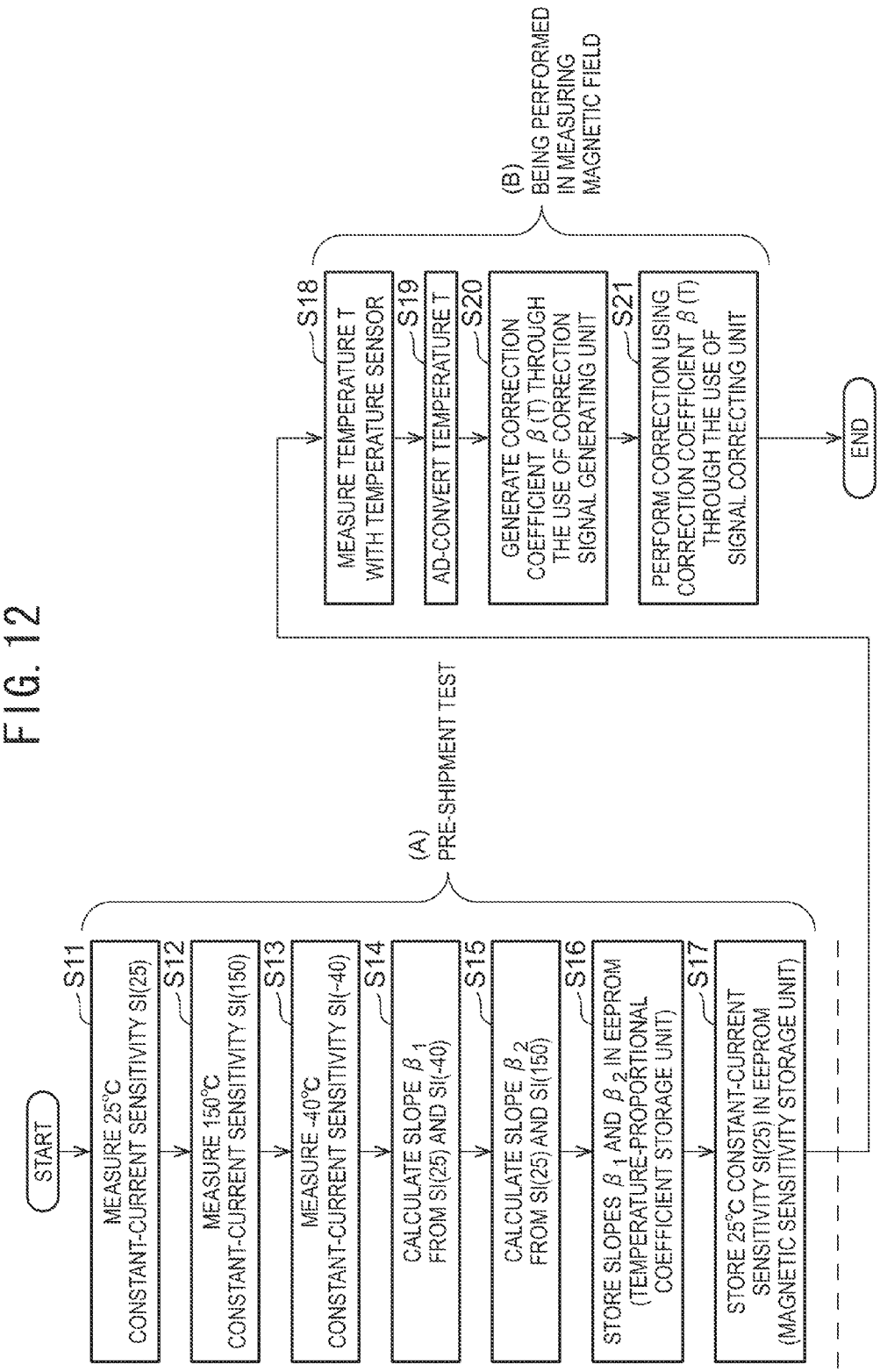
FIG. 12 is a flowchart illustrating Example 2 of the signal correcting method of the magnetic sensor according to the present invention illustrated in FIG. 5.

FIG. 12 is a flowchart illustrating Example 2 of the signal correcting method of the magnetic sensor according to the present invention illustrated in FIG. 5 and illustrates a correction flow in the pre-shipment inspection. The signal correcting method of the magnetic sensor in Example 2 includes a process (A) of performing the pre-shipment test and a process (B) performed at the time of measuring a magnetic field.

In the process (A) of performing the pre-shipment test, first, a first constant-current sensitivity SI25 at a first temperature of 25° C. is measured (step S11). Then, a second constant-current sensitivity SI150 at a second temperature of 150° C. is measured (step S12). Then, a third constant-current sensitivity SI-40 at a third temperature of −40° C. is measured (step S13). Then, a slope β1 is calculated from the first constant-current sensitivity SI25 and the third constant-current sensitivity SI-40 (step S14). A slope β2 is calculated from the first constant-current sensitivity SI25 and the second constant-current sensitivity SI150 (step S15). Then, the slopes β1 and β2 are stored in the temperature-proportional coefficient storage unit 28 (step S16). Then, the first constant-current sensitivity SI25 is stored in the magnetic sensitivity storage unit 29 (step S17).

In the process (B) performed at the time of measuring a magnetic field, first, a temperature T is measured by the temperature sensor 26 (step S18). Then, the temperature T is AD-converted (step S19). Then, a correction coefficient β(T) is generated by the correction signal generating unit 30 (step S20). Then, an output signal of the Hall device 21 is corrected using the correction coefficient β(T) by the signal correcting unit 31 (step S21).

That is, the process (B) performed at the time of measuring a magnetic field includes a step of acquiring information on the temperature characteristics of the Hall device, by the temperature sensor 26, a step of generating a correction signal for correcting the output of the Hall device on the basis of the output of the temperature sensor 26 and the information on the temperature characteristics of the Hall device, by the correction signal generating unit 30, and a step of correcting the output signal of the Hall device using the correction signal, by the signal correcting unit 31.

That is, $\beta_1$ and $\beta_2$ calculated by the correction coefficient calculating block in FIG. 12 can be obtained using Expression (12).

$SI(-40)$ : constant-current sensitivity at $-40°C$ (13)

$SI(25)$ : constant-current sensitivity at $25°C$ $SI(150)$ : constant-current sensitivity at $150°C$ $$\beta_1 = \frac{SI(25) - SI(-40)}{(25 - -40)} (T = -40 \sim 25°C)$$

-continued $$\beta_2 = \frac{SI(150) - SI(25)}{(150 - 25)} (T = 25 \sim 150°C)$$

Figure 13:
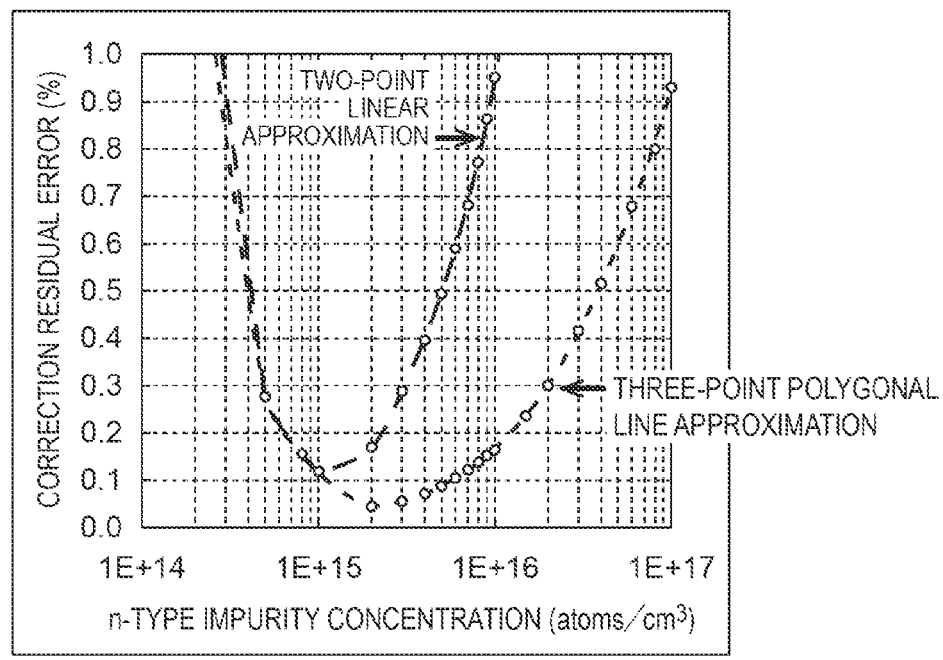
FIG. 13 is a diagram illustrating a relationship of a three-point polygonal line approximation error with respect to an n-type impurity concentration.

FIG. 13 is a diagram illustrating a relationship of the correction residual error with respect to the n-type impurity concentration and illustrates the result when the correction residual error (three-point polygonal line approximation error) after being corrected using three-point polygonal line approximation. When the n-type impurity concentration N satisfies $7.0 \times 10^{14} < N < 1.0 \times 10^{16}$ (atoms/cm$^3$), the correction residual error can be reduced to 0.2%.

Since the range of the distribution depth D in consideration of the depletion layer region is the same as in Example 1, the n-type impurity concentration N and the distribution depth D satisfying Expression (3) can be preferably used to implement a magnetic sensor with high magnetic field detection accuracy using three-point polygonal line approximation and the n-type impurity concentration N and the distribution depth D satisfying Expression (4) can be more preferably used. These ranges are illustrated in FIG. 4.

The constant-current sensitivity has such a tendency that the second-order temperature characteristic at a low temperature is reduced but the second-order temperature characteristic at a high temperature is relatively easy to exhibit, as the n-type impurity concentration N is lowered. Multi-point correction of three points or more can be used to more accurately correct the second-order temperature characteristic at a high temperature. In the range of the n-type impurity concentration indicated by Expression (3) or (4), the correction error after multi-point correction is reduced in comparison with the case where the n-type impurity concentration N is high, thereby implementing a magnetic sensor with higher accuracy.

Example 3

Examples 1 and 2 describe an example of 4-phase chopper drive, but Example 3 describes an example of 2-phase chopper drive. When the 2-phase chopper drive is employed, the residual offset increases. The distribution depth D capable of reducing the residual offset is defined in this example (D≥4 μm).

That is, Examples 1 and 2 describe an example where the offset is dynamically removed by the 4-phase chopper drive, but the 2-phase chopper drive is used for a current sensor requesting for rapid responsiveness. The 2-phase chopper drive is excellent in responsiveness because the measuring time of one cycle is shorter than that of the 4-phase chopper drive.

As a driving order in an example of the 2-phase chopper drive, a Hall drive current is made to flow from Electrode 1 to Electrode 3 and Electrode 2 and Electrode 4 are connected to the differential amplifier in Phase 1, and a Hall drive current is made to flow from Electrode 2 to Electrode 4 and Electrode 3 and Electrode 1 are connected to the differential amplifier in Phase 2.

Phase1 $S_1 = SI \times I_H \times B + Offset_1$

Phase2 $S_2 = SI \times I_H \times B + Offset_2$ $S_1 + S_2 = 2SI \times I_H \times B$ $Offset_1 + Offset_2 \cong 0$ (14)

The offset can be removed in the 2-phase chopper drive, but the offset removing effect is poorer than that in the 4-phase chopper drive. As a method of reducing the residual offset remaining after the 2-phase chopper drive is performed, there is a method of extending the diffusion time of implants to homogeneousness of implants in the n-type impurity region. When the diffusion time of implants is extended, the distribution depth D of the n-type impurity region increases.

Figure 14:
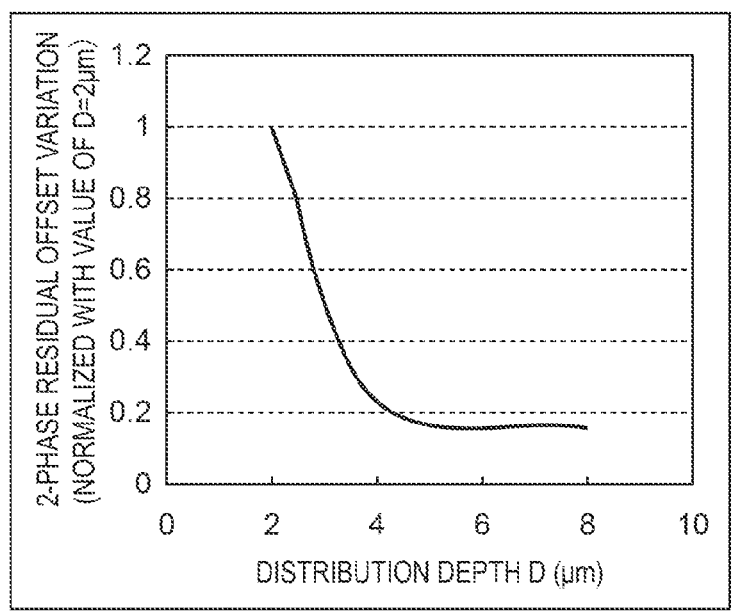
FIG. 14 is a diagram illustrating a relationship between a distribution depth and a residual offset variation in Example 3.
Figure 15:
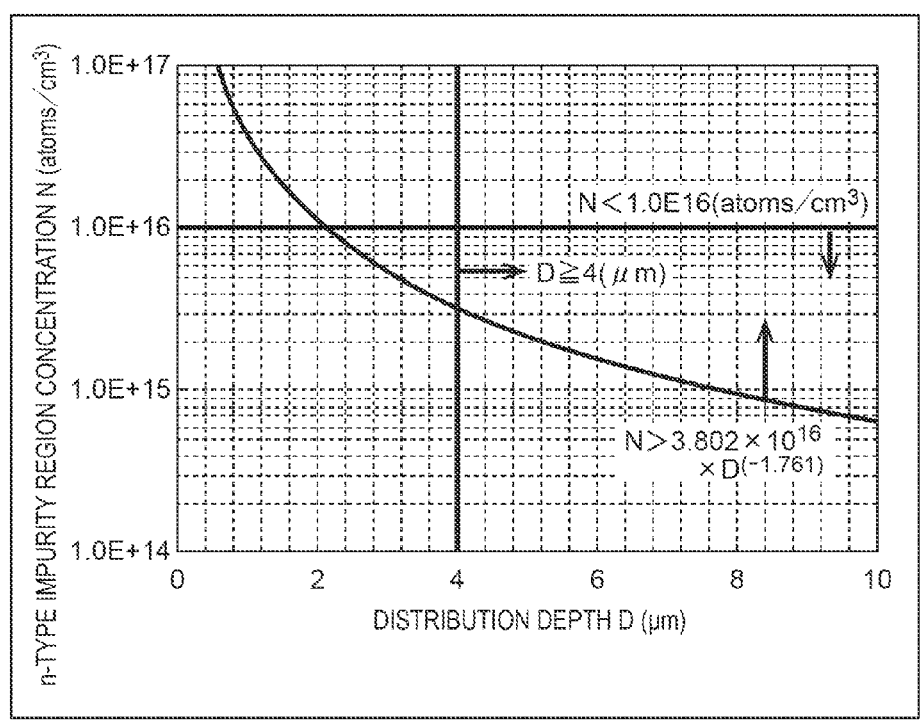
FIG. 15 is a diagram illustrating a relationship between a distribution depth and a concentration of an n-type impurity region.

FIG. 14 is a diagram illustrating a relationship between the distribution depth and the residual offset variation in Example 3. With the distribution depth D of 4 μm or less, it can be seen that the residual offset variation rapidly increases in the 2-phase chopper drive. Accordingly, it is preferable that the n-type impurity concentration and the distribution depth satisfying Expression (15) be used for the 2-phase chopper drive. FIG. 15 is a diagram illustrating a relationship between the distribution depth and the concentration of the n-type impurity concentration and illustrates the range indicated by Expression (15).

$$N < 1.0 \times 10^{16}$$

$$N > 3.802 \times 10^{16} \times D^{-1.781}$$

$$4 \leq D \quad (15)$$

Example 4

In Example 1, the two-point linear correction (calculating a slope β for each sample) has been performed. In Example 4, one-point correction and correction using a representative value of the slope β of the constant-current sensitivity with respect to the temperature (calculating a slope at only one point for each sample) are performed. In Example 4, the magnetic field detection accuracy is poorer in comparison with Example 1, but a low cost can be realized.

When the corrosion is performed using the representative value of the slope β with the n-type impurity concentration and the distribution depth of the Hall device according to the related art, the correction residual error is large. On the contrary, the correction residual error is not large even when the correction is performed using the representative value of the slope β in the range of the Hall device according to the present invention.

By setting the n-type impurity concentration N and the distribution depth D to the range indicated by Expression (3) or (4), it may be possible to implement a high-accuracy magnetic sensor by only the correction of the absolute value of one-point temperature. The block diagram used to describe the magnetic sensor in Example 4 is the same as in Examples 1 and 2.

Figure 16:
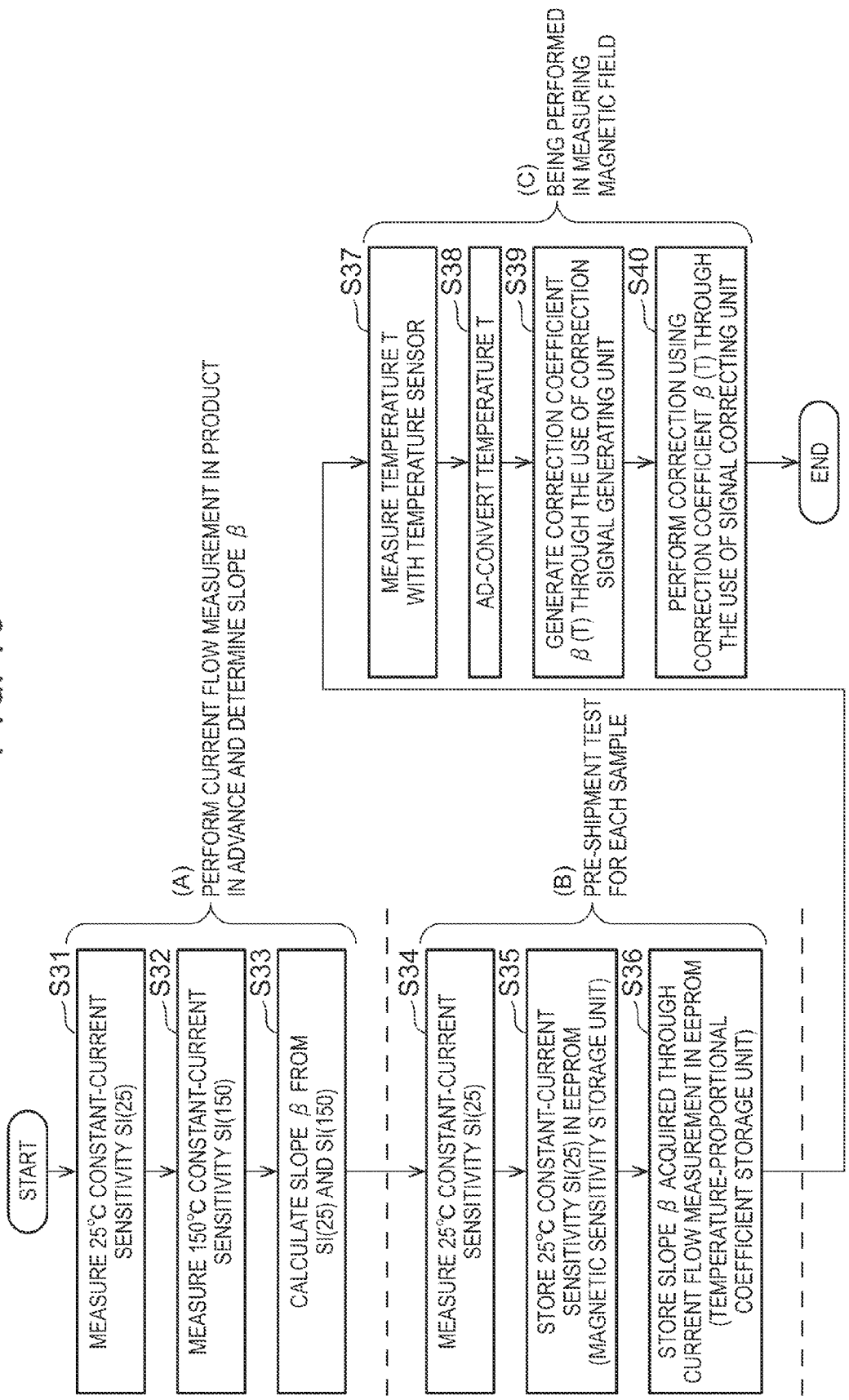
FIG. 16 is a flowchart illustrating Example 4 of the signal correcting method of the magnetic sensor according to the present invention illustrated in FIG. 5.

FIG. 16 is a flowchart illustrating Example 4 of the signal correcting method of the magnetic sensor according to the present invention illustrated in FIG. 5. The signal correcting method of the magnetic sensor according to Example 4 includes a process (A) of performing current flow measurement in a product in advance to determine the slope β of the constant-current sensitivity with respect to the temperature, a process (B) of performing a pre-shipment test for each sample, and a process (C) performed at the time of measuring a magnetic field.

In the process (A) of performing current flow measurement in a product in advance, first, a first constant-current sensitivity SI25 at a first temperature of 25° C. is measured (step S31). Then, a second constant-current sensitivity SI150 at a second temperature of 150° C. is measured (step S32). Then, a slope β of the constant-current sensitivity with respect to the temperature is calculated from the first constant-current sensitivity SI25 and the second constant-current sensitivity SI150 (step S33). In the process (B) of performing the pre-shipment test for each sample, the first constant-current sensitivity SI25 at the first temperature of 25° C. is measured (step S34). Then, the first constant-current sensitivity SI25 is stored in the magnetic sensitivity storage unit 29 (step S35). Then, the slope β acquired through the current flow measurement is stored in the temperature-proportional coefficient storage unit 28 (step S36).

In the process (C) performed at the time of measuring a magnetic field, first, a temperature T is measured by the temperature sensor 26 (step S37). Then, the temperature T is AD-converted (step S38). Then, a correction coefficient β(T) is calculated by the correction signal generating unit 30 (step S39). Then, an output signal of the Hall device 11 is corrected using the correction coefficient β(T) by the signal correcting unit 31 (step S40).

That is, the process performed at the time of measuring a magnetic field includes a step of acquiring information on the temperature characteristics of the Hall device, by the temperature sensor 26, a step of generating a correction signal for correcting the output of the Hall device on the basis of the output of the temperature sensor 26 and the information on the temperature characteristics of the Hall device, by the correction signal generating unit 30, and a step of correcting the output signal of the Hall device using the correction signal, by the signal correcting unit 31.

Example 1 has described that the constant-current sensitivity at two-point temperatures is measured for each sample and the slope β of the constant-current sensitivity with respect to the temperature is calculated. On the contrary, in Example 4, the slope β of the constant-current sensitivity with respect to the temperature is corrected using the representative value as the current flow measurement result. In this case, the current flow measurement needs to be performed in advance to calculate the slope β, but since only the constant-current sensitivity at a one-point temperature can be measured for each sample, it is possible to reduce the test cost. In comparison with Example 1, the accuracy of the slope β of the constant-current sensitivity with respect to the temperature is poorer, but it is possible to suppress deterioration of the accuracy of the slope β by setting the n-type impurity concentration N and the distribution depth D to the range indicated by Expression (3) or (4).

Figure 17:
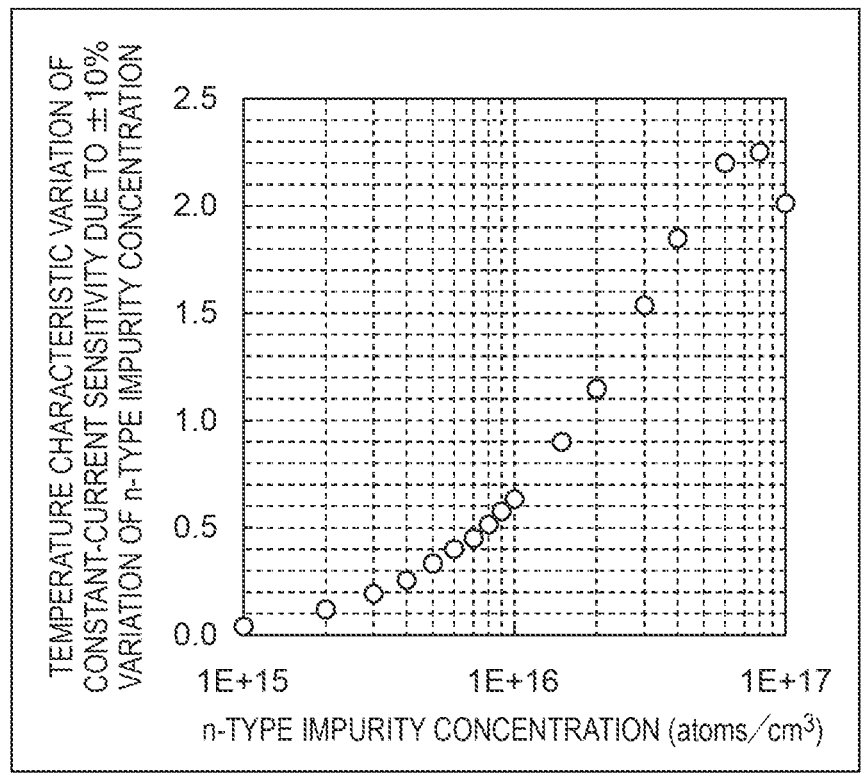
FIG. 17 is a diagram illustrating a relationship between a temperature characteristic variation of a constant-current sensitivity with respect to an n-type impurity concentration.

FIG. 17 is a diagram illustrating a relationship between a temperature characteristic variation of the constant-current sensitivity with respect to the n-type impurity concentration. In comparison with calculation of β for each sample, the calculation result of how the accuracy deteriorates is described by performing the correction using the representative value β as the current flow measurement result. From FIG. 17, it can be seen that the accuracy rapidly deteriorates in the range in which the n-type impurity concentration is equal to or more than $1.0 \times 10^{16}$ (atoms/cm$^3$), but the deterioration of the accuracy is suppressed in the range in which the n-type impurity concentration is less than $1.0 \times 10^{16}$ (atoms/cm$^3$).

That is, in the related art, the accuracy is secured by approximating the temperature characteristics of the constant-current sensitivity to a multi-point polygonal line as described in Patent Document 3. On the contrary, by setting the n-type impurity concentration N and the distribution depth D to the range indicated by Expression (3) or (4), the accuracy can be secured only by calculating the slope of the constant-current sensitivity with respect to the temperature by measuring the current flow in advance and measuring the constant-current sensitivity at a one-point temperature, and it is thus possible to implement a magnetic sensor with high magnetic field detection accuracy at a low cost.

Examples 1 to 4 have described that the correction is performed in the back stage of the integrator 15, but the correction may be performed in the front stage of the integrator 15. A signal for performing the correction may be output to the outside of the magnetic sensor IC and the correction operation may be performed in the outside of the IC. Since the correction operation has only to be performed on the signal proportional to the magnetic field B, the constant-current sensitivity SI, the drive current $I_H$ of the Hall device, the magnetic field intensity B, and the signal XB proportional to the magnetic field intensity B may be subjected to the correction. That is, the correction includes correction of physical quantities based on the Hall electromotive force, and thus the physical quantities based on the Hall electromotive force include the Hall electromotive force signal $V_H$, the constant-current sensitivity SI(T), the Hall drive current $I_H$, the magnetic field B, and quantities proportional to the physical quantities.

As described above, by using the Hall device according to the present invention, it is possible to provide a magnetic sensor including: a Hall device including a p-type impurity region and an n-type impurity region disposed on the p-type impurity region so as to serve as a magnetosensitive portion; a temperature characteristic storage unit storing information on temperature characteristics of the Hall device calculated from an output of the Hall device measured at two-point to five-point temperatures; a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of −40° C. to 150° C.

It is possible to provide a magnetic sensor including: a Hall device including a p-type impurity region and an n-type impurity region disposed on the p-type impurity region so as to serve as a magnetosensitive portion; a temperature characteristic storage unit storing information on temperature characteristics of the Hall device calculated from an output of the Hall device measured at two-point to three-point temperatures; a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of 25° C. to 150° C.

The above-mentioned embodiments have mainly described the example where the information on the temperature characteristics of the Hall device is calculated from the output of the Hall device measured at two-point or three-point temperatures, but the present invention is not limited to this example. The information on the temperature characteristics of the Hall device may be calculated from the output of the Hall device measured at temperatures of four points or more. From the viewpoint of the number of processes required for calculating the information on the temperature characteristics of the Hall device, the information on the temperature characteristics of the Hall device is preferably calculated from the output of the Hall device measured at temperatures of five points or less, more preferably from the output of the Hall device measured at temperatures of four points or less, and still more preferably from the output of the Hall device measured at temperatures of three points or less.

The above-mentioned embodiments have mainly described the example where the temperature-proportional coefficient β is calculated from the magnetic sensitivity of the Hall device measured at two-point or three-point temperatures, but the temperature-proportional coefficient β may be calculated from the magnetic sensitivity of the Hall device measured at temperatures of four points or more. From the viewpoint of the number of processes required for calculating the temperature-proportional coefficient β, the temperature-proportional coefficient β is preferably calculated from the magnetic sensitivity of the Hall device measured at temperatures of five points or less, more preferably from the magnetic sensitivity of the Hall device measured at temperatures of four points or less, and still more preferably from the magnetic sensitivity of the Hall device measured at temperatures of three points or less.

As described above, according to the present invention, it is possible to realize a Hall device which can detect a magnetic field intensity with high accuracy and achieve improvement in linearity of the temperature characteristics by specifying the concentration and the depth of the n-type impurity region as a magnetosensitive portion of the Hall device to appropriate ranges, a magnetic sensor having the Hall device, and a signal correcting method thereof.

REFERENCE SIGNS LIST

1: p-type impurity region
2: n-type impurity region (magnetosensitive portion)
3: electrode portion
4: depletion layer
21: Hall device
22: Hall drive current source
23: chopper switch unit
24: differential amplifier
25: integrator
26: temperature sensor
27: analog-to-digital converter (ADC)
28: temperature-proportional coefficient storage unit (EEPROM)
29: magnetic sensitivity storage unit (EEPROM)
30: correction signal generating unit
31: signal correcting unit
32: temperature characteristic storage unit

The invention claimed is:

1. A Hall device comprising:
a p-type impurity region; and
an n-type impurity region disposed on the p-type impurity region and serving as a magnetosensitive portion,
wherein an n-type impurity concentration N (atoms/cm$^3$) and a distribution depth D (μm) of the n-type impurity region satisfy following relational expressions:

$$N<1.0\times10^{16} \text{ and}$$

$$N>3.802\times10^{16}\times D^{-1.761},$$

wherein the n-type impurity concentration N represents a maximum concentration of the n-type impurity concentration in the n-type impurity region and the distribution depth D represents a length in depth direction from a point at which the n-type impurity concentration is a maximum to a point at which the n-type impurity concentration is 1/10 of the n-type impurity concentration N.

2. The Hall device according to claim 1, wherein the n-type impurity concentration N and the distribution depth D satisfy a relational expression of $N>3.410\times10^{16}\times D^{-1.293}$.

3. The Hall device according to claim 2, wherein the distribution depth D satisfies a relational expression of $D\leq15$.

4. The Hall device according to claim 1, wherein the distribution depth D satisfies a relational expression of $D\leq15$.

5. The Hall device according to claim 1, wherein the distribution depth D satisfies a relational expression of $4\leq D$.

6. The Hall device according to claim 1, further comprising a silicon oxide layer covering the n-type impurity region.

7. The Hall device according to claim 6, wherein the n-type impurity region is contacting with the silicon oxide layer.

8. The Hall device according to claim 1, wherein the n-type impurity concentration N satisfies a relational expression of $3.0\times10^{14}<N$.

9. A magnetic sensor comprising the Hall device according to claim 1.

10. The magnetic sensor according to claim 9, further comprising:
a temperature characteristic storage unit storing information on the temperature characteristics of the Hall device;
a correction signal generating unit generating a correction signal for correcting an output of the Hall device on the basis of an output of a temperature sensor and the information on the temperature characteristics of the Hall device; and
a signal correcting unit receiving inputs of the correction signal generated by the correction signal generating unit and an output signal of the Hall device input and correcting the output signal of the Hall device on the basis of the correction signal.

11. The magnetic sensor according to claim 10, wherein the temperature characteristic storage unit includes:
a temperature-proportional coefficient storage unit storing information on a temperature-proportional coefficient of a magnetic sensitivity of the Hall device; and
a magnetic sensitivity storage unit storing information on the magnetic sensitivity of the Hall device at a predetermined temperature,
wherein the information on the temperature characteristics of the Hall device includes the information on the temperature-proportional coefficient of the magnetic sensitivity of the Hall device and the information on the magnetic sensitivity of the Hall device at the predetermined temperature.

12. The magnetic sensor according to claim 11, wherein the information on the temperature-proportional coefficient of the magnetic sensitivity of the Hall device stored in the temperature-proportional coefficient storage unit is information on a temperature-proportional coefficient of a constant-current sensitivity of the Hall device, and
wherein the information on the magnetic sensitivity of the Hall device at the predetermined temperature stored in the magnetic sensitivity storage unit is information on the constant-current sensitivity of the Hall device at the predetermined temperature.

13. The magnetic sensor according to claim 11, wherein the information on the temperature-proportional coefficient of the magnetic sensitivity of the Hall device is information calculated from a first magnetic sensitivity of the Hall device measured at a first temperature and a second magnetic sensitivity of the Hall device measured at a second temperature.

14. The magnetic sensor according to claim 13, wherein the first magnetic sensitivity is the constant-current sensitivity of the Hall device measured at the first temperature and the second magnetic sensitivity is the constant-current sensitivity of the Hall device measured at the second temperature.

15. The magnetic sensor according to claim 13, wherein the information on the temperature-proportional coefficient of the magnetic sensitivity of the Hall device is information calculated from the first magnetic sensitivity, the second magnetic sensitivity, and a third magnetic sensitivity of the Hall device measured at a third temperature.

16. The magnetic sensor according to claim 15, wherein the third magnetic sensitivity is the constant-current sensitivity of the Hall device measured at the third temperature.

17. The magnetic sensor according to claim 11, wherein the information on the temperature-proportional coefficient of the magnetic sensitivity of the Hall device is calculated from the magnetic sensitivities of the Hall device measured at two-point to five-point temperatures.

18. The magnetic sensor according to claim 17, wherein the information on the temperature-proportional coefficient of the magnetic sensitivity of the Hall device is calculated from the magnetic sensitivities of the Hall device measured at two-point to three-point temperatures.

19. The magnetic sensor according to claim 10, wherein the information on the temperature characteristics of the Hall device is calculated from the output of the Hall device measured at two-point to five-point temperatures.

20. The magnetic sensor according to claim 19, wherein the information on the temperature characteristics of the Hall device is calculated from the output of the Hall device measured at two-point to three-point temperatures.

21. A signal correcting method of the magnetic sensor according to claim 9, comprising the steps of:
acquiring information on the temperature characteristics of the Hall device;
generating a correction signal for correcting an output of the Hall device on the basis of an output of a temperature sensor and the information on the temperature characteristics of the Hall device;
acquiring an output of the Hall device; and
correcting the output signal of the Hall device using the correction signal.

22. The signal correcting method of the magnetic sensor according to claim 21, wherein the information on the temperature characteristics of the Hall device includes the information on the temperature-proportional coefficient of the magnetic sensitivity of the Hall device and the information on the magnetic sensitivity of the Hall device at the predetermined temperature, and wherein the step of acquiring the information on the temperature characteristics of the Hall device includes a step of acquiring the information on the temperature-proportional coefficient of the magnetic sensitivity of the Hall device and the information on the magnetic sensitivity of the Hall device at the predetermined temperature.

23. The signal correcting method of the magnetic sensor according to claim 22, wherein the information on the temperature-proportional coefficient of the magnetic sensitivity of the Hall device is information on a temperature-proportional coefficient of a constant-current sensitivity of the Hall device, and wherein the information on the magnetic sensitivity of the Hall device at the predetermined temperature is information on the constant-current sensitivity of the Hall device at the predetermined temperature.

24. The signal correcting method of the magnetic sensor according to claim 22, wherein the information on the temperature-proportional coefficient of the magnetic sensitivity of the Hall device is information calculated from a first magnetic sensitivity of the Hall device measured at a first temperature and a second magnetic sensitivity of the Hall device measured at a second temperature.

25. The signal correcting method of the magnetic sensor according to claim 24, wherein the first magnetic sensitivity is the constant-current sensitivity of the Hall device measured at the first temperature and the second magnetic sensitivity is the constant-current sensitivity of the Hall device measured at the second temperature.

26. The signal correcting method of the magnetic sensor according to claim 24, wherein the information on the temperature-proportional coefficient of the magnetic sensitivity of the Hall device is information calculated from the first magnetic sensitivity, the second magnetic sensitivity, and a third magnetic sensitivity of the Hall device measured at a third temperature.

27. The signal correcting method of the magnetic sensor according to claim 26, wherein the third magnetic sensitivity is the constant-current sensitivity of the Hall device measured at the third temperature.

28. The signal correcting method of the magnetic sensor according to claim 22, wherein the information on the temperature-proportional coefficient of the magnetic sensitivity of the Hall device is calculated from the magnetic sensitivities of the Hall device measured at two-point to five-point temperatures.

29. The signal correcting method of the magnetic sensor according to claim 28, wherein the information on the temperature-proportional coefficient of the magnetic sensitivity of the Hall device is calculated from the magnetic sensitivities of the Hall device measured at two-point to three-point temperatures.

30. The signal correcting method of the magnetic sensor according to claim 21, wherein the information on the temperature characteristics of the Hall device is calculated from the output of the Hall device measured at two-point to five-point temperatures.

31. The signal correcting method of the magnetic sensor according to claim 30, wherein the information on the temperature characteristics of the Hall device is calculated from the output of the Hall device measured at two-point to three-point temperatures.

32. The signal correcting method of the magnetic sensor according to claim 21, wherein the step of acquiring the information on the temperature characteristics of the Hall device includes:

a step of measuring a first magnetic sensitivity of the Hall device at a first temperature;
a step of measuring a second magnetic sensitivity of the Hall device at a second temperature; and
a step of acquiring information on the temperature-proportional coefficient of the magnetic sensitivity of the Hall device from the first magnetic sensitivity and the second magnetic sensitivity,
wherein the step of generating the correction signal for correcting the output of the Hall device on the basis of the output of the temperature sensor and the information on the temperature characteristics of the Hall device is a step of generating the correction signal for correcting the output of the Hall device on the basis of the output of the temperature sensor, the information on the temperature-proportional coefficient of the magnetic sensitivity of the Hall device, and the magnetic sensitivity of the Hall device at a predetermined temperature.

33. The signal correcting method of the magnetic sensor according to claim 32, wherein the magnetic sensitivity is a constant-current sensitivity.

34. The signal correcting method of the magnetic sensor according to claim 21, wherein the step of acquiring the information on the temperature characteristics of the Hall device includes:

a step of measuring a first magnetic sensitivity of the Hall device at a first temperature;
a step of measuring a second magnetic sensitivity of the Hall device at a second temperature;
a step of measuring a third magnetic sensitivity of the Hall device at a third temperature; and
a step of acquiring information on the temperature-proportional coefficient of the magnetic sensitivity of the Hall device from the first magnetic sensitivity, the second magnetic sensitivity, and the third magnetic sensitivity,
wherein the step of generating the correction signal for correcting the output of the Hall device on the basis of the output of the temperature sensor and the temperature characteristics of the Hall device is a step of generating the correction signal for correcting the output of the Hall device on the basis of the output of the temperature sensor, the information on the temperature-proportional coefficient of the magnetic sensitivity of the Hall device, and the magnetic sensitivity of the Hall device at a predetermined temperature.

35. The signal correcting method of the magnetic sensor according to claim 21, wherein the step of acquiring the information on the temperature characteristics of the Hall device is performed prior to shipment, and wherein the step of generating the correction signal for correcting the output of the Hall device on the basis of the output of the temperature sensor and the information on the temperature characteristics of the Hall device, the step of acquiring the output of the Hall device, and the step of correcting the output signal of the Hall device using the correction signal are performed at the time of measuring a magnetic field.

36. A magnetic sensor comprising:

a Hall device including a p-type impurity region and an n-type impurity region disposed on the p-type impurity region so as to serve as a magnetosensitive portion;
a temperature characteristic storage unit storing information on temperature characteristics of the Hall device calculated from an output of the Hall device measured at two-point to five-point temperatures;
a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of −40° C. to 150° C.

37. The magnetic sensor according to claim 36, wherein the temperature characteristic storage unit stores information on temperature characteristics of the Hall device calculated from the output of the Hall device measured at two-point to three-point temperatures.

38. A magnetic sensor comprising:

a Hall device that including a p-type impurity region and an n-type impurity region disposed on the p-type impurity region so as to serve as a magnetosensitive portion;

a temperature characteristic storage unit storing information on temperature characteristics of the Hall device calculated from an output of the Hall device measured at two-point to three-point temperatures;

a correction signal generating unit generating a correction signal for correcting the output of the Hall device on the basis of an output of a temperature sensor and the information on the temperature characteristics of the Hall device; and a signal correcting unit receiving inputs of the correction signal generated by the correction signal generating unit and an output signal of the Hall device input thereto, correcting the output signal of the Hall device on the basis of the correction signal, and outputting the corrected output signal of the Hall device, wherein the magnetic sensor satisfies a correction residual error $E_R$ expressed by $E_R=((V_{MAX}/V_{25})-(V_{MIN}/V_{25}))/2$ is equal to or less than 1.0%, wherein $V_{25}$ represents a output value the signal correcting unit outputs when a magnetic field with a predetermined magnitude and a predetermined direction is applied to the magnetic sensor under a temperature environment of 25° C. and $V_{MAX}$ and $V_{MIN}$ represent a largest output value and a smallest output value the signal correcting unit outputs when a magnetic field with the predetermined magnitude and the predetermined direction is applied to the magnetic sensor under a temperature environment of 25° C. to 150° C.

39. The magnetic sensor according to claim 38, wherein the temperature characteristic storage unit stores information on temperature characteristics of the Hall device calculated from the output of the Hall device measured at two-point to three-point temperatures.

* * * * *